United States Patent [19]
Kamijo

[11] Patent Number: 5,942,309
[45] Date of Patent: Aug. 24, 1999

[54] SPIN VALVE MAGNETORESISTIVE DEVICE

[75] Inventor: Atsushi Kamijo, Tokyo, Japan

[73] Assignee: NEC Corporation, Tokyo, Japan

[21] Appl. No.: 08/892,183

[22] Filed: Jul. 14, 1997

[30] Foreign Application Priority Data

Jul. 12, 1996 [JP] Japan .................................. 8-183476

[51] Int. Cl.⁶ ...................................................... G11B 5/66
[52] U.S. Cl. ..................... 428/141; 428/692; 428/694 R; 428/694 T; 428/694 TS; 428/694 TM; 428/900; 360/113
[58] Field of Search ........................... 428/694 R, 694 T, 428/694 TS, 694 TM, 692, 900, 694 ST, 141; 360/113

[56] References Cited

U.S. PATENT DOCUMENTS

| | | | |
|---|---|---|---|
| 5,549,978 | 8/1996 | Iwasaki | 428/692 |
| 5,800,931 | 9/1998 | Lee | 428/611 |

OTHER PUBLICATIONS

A. Chaiken et al., "Low–field spin–valve magnetoresistance in Fe–Cu–Co sandwiches", pp. 240–242, Appl. Phys. Lett. vol. 59, No. 2, Jul. 8, 1991.

B. Dieny et al., "Giant magnetoresistance in soft ferro–magnetic multilayers", pp. 1297–1299, The American Physical Society, Physical Review B, vol. 43, No. 1, Jan. 1, 1991.

A. Barthelemy et al., "Magnetic and transport properties of Fe/Cr superlattices (invited)", pp. 5908–5913, J. Appl. Phys. vol. 67, No. 9, May 1, 1990.

D.H. Mosca et al., "Oscillatory interlayer coupling and giant magnetoresistance in Co/Cu multilayers", pp. L1–L5, Journal of Magnetism and Magnetic Materials, vol. 94, 1991.

W.F. Egelhoff, Jr. et al., "Magnetoresistance values exceeding 21% in symmetric spin valves", pp. 273–277, American Institute of Physics, J. Appl. Phys. vol. 78, No. 1, Jul. 1, 1995.

*Primary Examiner*—Leszek Kiliman
*Attorney, Agent, or Firm*—Young & Thompson

[57] ABSTRACT

A spin valve magnetoresistive multi-layered structure includes a first type magnetic layer which magnetization is free to rotate in accordance with an external applied magnetic field, a non-magnetic spacer layer adjacent to said first type magnetic film, and a second type magnetic layer adjacent to said non-magnetic film so that said second type magnetic layer is separated by said non-magnetic spacer layer from said first type magnetic layer, wherein said second type magnetic layer has a facet single crystal grain structure with a uniform crystal orientation whilst the first type magnetic layer is free of any facet single crystal grain structure with a uniform crystal orientation.

38 Claims, 6 Drawing Sheets

SPIN VALVE MAGNETORESISTIVE DEVICE

BACKGROUND OF THE INVENTION

The present invention relates to a thin film exhibiting magnetoresistance effects for magnetic sensor such as magnetic head. Ferromagnetic such as permalloy which exhibits magnetoresistance effects have been on the use of various magnetic sensors such as magnetic heads. Magnetoresistance effects are the phenomenon of variation in electric resistance with application of a magnetic field. Such magnetoresistance effect alloy such as permalloy shows an anisotropic magnetoresistance effect of variation in electric resistivity depending upon a relative angle of an orientation of magnetization to a current direction. Permalloy thin films used for magnetic heads of magnetic recorders show an anisotropic magnetoresistance variation of 2–3%.

In recent years, the requirement for high density magnetic recording has been on the increase. For satisfying this requirement, it has been required to develop a material showing a large magnetoresistance variation. A magnetic sensor such as magnetic head is required to detect a slight leakage of magnetic field from a magnetic recording medium, for which reason a material showing a large magnetoresistance variation under a small magnetic field, for example, not more than 100 Oe (Oersteds) (=8 kA/m) is required for highly sensitive magnetic sensor.

In recent years, magnetic multilayers (or superlattices) have been attracted as a material which realizes a giant magnetoresistance effect. In Journal of Applied Physics 67(9), May 1, 1990, pp. 50908–5913, it is disclosed that Fe(001)/Cr(001) superlattices with antiferromagnetic interlayer coupling exhibit a giant magnetoresistance at room temperature when an applied field aligns the magnetization of the Fe layers, the resistivity drops a factor of 2 and this giant magnetoresistance can be ascribed to the spin dependent scattering at interfaces. In Journal of Magnetism and Magnetic Materials 94, 1991, L1–L5, it is disclosed that Co/Cu multilayers with antiferromagnetic interlayer coupling exhibit a giant magnetoresistance at room temperature. Under the zero magnetic field, magnetic moments in the ferromagnetic metal layer (Fe or Co) intervened by the non-magnetic metal layer (Cr or Cu) antiferromagnetically align. With application of magnetic field, the magnetic moments in the ferromagnetic metal layers are changed to ferromagnetically align thereby electrical resistivity is dropped. This phenomenon is called as giant magnetoresistance effect which is different in mechanism from the anisotropic magnetoresistance effects of the permalloy. The above superlattice and multilayer structures have disadvantages in large exchange-interaction between the ferromagnetic layers which causes the orientation of the magnetization of the ferromagnetic layer is unlikely to be changed by an externally applied magnetic field. The magnetic field for saturation of the magnetoresistance is a few kOe to 10 kOe. Such superlattices and multilayers having large saturation magnetic fields are not available for highly sensitive magnetic sensor such as magnetic head.

In order to satisfy the above disadvantages in large saturation magnetic fields with the magnetic superlattices and multilayers, spin valve magnetoresistance effect films have been proposed wherein two magnetic films are structurally and magnetically separated by a non-magnetic spacer layer. This spin valve structure is disclosed in Japanese laid-open patent publication Nos. 2-61572, 4-358310 and 6-60336. In the spin valve structure, first one of the two magnetic films allows the magnetization to be pined whilst second one of the two magnetic films allows the magnetization to rotate in accordance with an externally applied magnetic field. The first one is so called as a pined layer pining the magnetization and the second one is so called as a free layer allowing the magnetization to rotate freely. In the spin valve structure, the magnetoresistance varies depending upon the relative angle of the above pined and free layers. In order to pin the magnetization of one of the magnetic layers, it was proposed that two magnetic metal layers having different coercive forces from each other are provided to sandwich a non-magnetic spacer layer. This structure is disclosed in Applied Physics Letters, 59(2), Jul. 8, 1991, pp. 240–242. Fe—Co—Cu sandwich structure is used, wherein Fe layer is a first magnetic layer having a small coercive force whilst Co layer is a second magnetic layer having a large coercive force and Cu layer is a non-magnetic spacer layer. Alternatively, it was also proposed that two soft magnetic metal layers are provided to sandwich the non-magnetic spacer layer and an antiferromagnetic layer is further provided adjacent to one of the two soft magnetic metal layers so that the magnetization of the soft magnetic metal layer adjacent to the antiferromagnetic layer is pined by an exchange-bias magnetic field due to exchange-interaction from the antiferromagnetic layer whilst another soft magnetic metal layer separated by the non-magnetic spacer layer from the soft magnetic metal layer adjacent to the antiferromagnetic thin film allows magnetization to rotate freely in accordance with the external magnetic field. In Physical Review B, vol. 4, No. 1, Jan. 1, 1991, pp. 1297–1300, it is disclosed that, in spin valve structure, Ni—Fe soft magnetic layers sandwich a Cu non-magnetic spacer layer and a Fe—Mn antiferromagnetic layer is provided adjacent to one of the Ni—Fe soft magnetic layers. Further alternatively, it was also proposed that two soft magnetic metal layers are provided to sandwich the non-magnetic spacer layer and an antiferromagnetic layer having a high electrical resistance and a large coercive force is further provided to contact with opposite ends of one of the two soft magnetic metal layers so that the magnetization of the soft magnetic metal layer in contact with the antiferromagnetic layer is pined whilst another soft magnetic metal layer separated by the non-magnetic spacer layer allows magnetization to rotate freely in accordance with the external magnetic field. In Japanese laid-open patent publication No. 6-325934, two Co—Fe soft magnetic metal layers are provided to sandwich a Cu non-magnetic spacer layer and a Co—Pt—Cr ferromagnetic metal layer having a high coercive force is provided to contact with one of the two Co—Fe soft magnetic metal layers.

The above three type spin valve structures utilize conduction electrons to be scattered in one direction and show a magnetoresistance variation in the range of 5–10%.

In order to obtain a further increase in the magnetoresistance variation, it was proposed that two non-magnetic spacer layers are provided to sandwich a free magnetic metal layer with magnetization to rotate freely in accordance with an externally applied magnetic field. Further two soft magnetic metal layers are provided to sandwich the two non-magnetic spacer layers sandwiching the free magnetic metal layer. Two ferromagnetic layers are provided adjacent to the two soft magnetic metal layers so as to pin the magnetization of the two soft magnetic metal layers whereby a symmetrical dual spin valve structure having five layered structure is formed. This is disclosed in Japanese laid-open patent publication No. 6-223336. The symmetrical dual spin valve structure can utilize conduction electrons to be scattered in any directions. Another dual spin valve is further disclosed in Journal of Applied Physics 78(1), Jul. 1, 1995, pp. 273–277. This symmetrical dual spin valve shows a large magnetoresistance effect exceeding 21%.

The magnetoresistance effect of the above spin valve structure depends upon the relative angle of the magnetic moments between the two soft magnetic layers sandwiching the two non-magnetic metal layers sandwiching the magnetic layer with magnetization free to rotate in accordance with the externally applied magnetic field. The magnetoresistance effect is, however, independent from the current direction. The magnetoresistance effect of the spin valve is thus considered to be generated by an analogous mechanism to that of the above mentioned magnetic superlattices. The magnetoresistance effect of the above spin valve structure differ from the above mentioned magnetic superlattices in providing one or more non-magnetic spacer layers which has such a sufficient thickness as to suppress an interfacial exchange-coupling between the two soft magnetic layers. The spin valve structure is likely to show a relatively large magnetoresistance variation but not exceeding that of the artificial lattice structure such as superlattice structure. The spin valve structure shows an extremely small saturation magnetic field for saturating the magnetoresistance. This means that the spin valve structure is highly sensitive to a slight magnetic field. In Japanese laid-open patent publication No. 6-60336, it is disclosed that the spin valve structure comprises a multi-layered structure of glass/Co(6 nm)/Cu (3.4 nm)/Fe—Mn(10 nm)/Cu(1 nm), which shows a large magnetoresistance variation of 8.7% under a small magnetic field in the range of 20–120 Oersteds. In the above second spin valve structure, the antiferromagnetic layer is used as an exchange-coupled film to pin the magnetization of one of the two magnetic layers whilst the other magnetic layer allows the magnetization to rotate freely in accordance with the externally applied magnetic field. This second type spin valve structure is superior in properties and facilitation of processing the same into a magnetic head, for which reason developments of the second type spin valve structure are more active.

The above antiferromagnetic exchange-coupled layer is the essential layer for the spin valve films. This antiferromagnetic exchange-coupled layer is required both to have a superior corrosion resistance and to provide a sufficiently large exchange-coupling magnetic field to the soft magnetic layer adjacent to the antiferromagnetic exchange-coupled layer. Fe—Mn alloy is capable of providing a large exchange-coupling magnetic field in the range of 200–400 Oersteds for pinning the magnetization of the adjacent soft magnetic layer and also gives a stable magnetoresistance. Nevertheless, Fe—Mn alloy is inferior in corrosion resistance, for which reason if Fe—Mn alloy is applied to the antiferromagnetic exchange-coulped layer included in the spin valve films, it is difficult to ensure a sufficient high reliability of the magnetic head using the spin valve films.

In Japanese laid-open patent publication No. 7-220246, it is disclosed that, in place of the Fe—Mn antiferromagnetic exchange-coupled layer for spin valve films, a NiO film is used as the antiferromagnetic exchange-coupled layer in the spin valve film. Namely, the antiferromagnetic oxide exchange-coupled layer is used for spin valve films. In Japanese laid-open patent publication No. 7-202292, it is also disclosed that, in place of the Fe—Mn antiferromagnetic exchange-coupled layer for spin valve films, NiO/CoO superlattice structure is used as the antiferromagnetic exchange-coupling layer in the spin valve film. Namely, the antiferromagnetic oxide exchange-coulped layer is used for spin valve films. The antiferromagnetic oxide is superior in corrosion resistance. Such antiferromagnetic oxide exchange-coupled layers are capable of providing small exchange-bias magnetic fields of approximately 100 Oersteds which is insufficient for pinning the magnetization of the soft magnetic layer adjacent to the antiferromagnetic oxide exchange-coupled layer because the maximum leakage magnetic field from the magnetic medium may exceed 100 Oersteds. If the antiferromagnetic oxide exchange-coupled layer is used in the spin valve films for the magnetic head, then the magnetization of the soft magnetic layer adjacent to the antiferromagnetic oxide exchange-coupling layer may rotate in accordance with such a large leakage magnetic field as exceeding 100 Oersteds from the magnetic medium although the magnetization should have to be pinned by the exchange-bias magnetic field provided by the antiferromagnetic oxide exchange-coupled layer. This means that the operations of the magnetic head is unstable.

In the above circumstances, it had been required to develop a novel magnetoresistive spin valve multi-layered structure showing stable performances and properties.

SUMMARY OF THE INVENTION

Accordingly, it is an object of the present invention to provide a novel spin valve multi-layer structure showing a large magnetoresistance, which is free from the disadvantages and problems as described above.

It is a further object of the present invention to provide a novel spin valve device showing a large magnetoresistance variation under a small magnetic field which is free from the disadvantages and problems as described above.

The above and other objects, features and advantages of the present invention will be apparent from the following descriptions.

The first present invention provides a spin valve magnetoresistive multi-layered structure including a first type magnetic layer which magnetization is free to rotate in accordance with an external applied magnetic field, a non-magnetic spacer layer adjacent to said first type magnetic film, and a second type magnetic layer adjacent to said non-magnetic film so that said first type magnetic layer is separated by said non-magnetic spacer layer from said second type magnetic layer, wherein said second type magnetic layer has a facet single crystal grain structure with a uniform crystal orientation whilst the first type magnetic layer is free of any facet single crystal grain structure with a uniform crystal orientation.

The second present invention provides a spin valve magnetoresistive multi-layered structure including a first type magnetic layer which magnetization is free to rotate in accordance with an external applied magnetic field, a non-magnetic spacer layer adjacent to the first type magnetic film, a second type magnetic layer adjacent to the non-magnetic film so that the first type magnetic layer is separated by the non-magnetic spacer layer from the second type magnetic layer, and a ferromagnetic layer adjacent to the second type magnetic layer wherein the ferromagnetic layer has a facet single crystal grain structure with a uniform crystal orientation whilst the first type magnetic layer is free of any facet single crystal grain structure with a uniform crystal orientation.

The third present invention provides a spin valve magnetoresistive multi-layered structure including a first type magnetic layer which magnetization is free to rotate in accordance with an external applied magnetic field, a non-magnetic spacer layer adjacent to the first type magnetic film, a second type magnetic layer adjacent to the non-magnetic film so that the first type magnetic layer is separated by the non-magnetic spacer layer from the second type magnetic layer, and a non-magnetic layer adjacent to the second type magnetic layer wherein the non-magnetic layer has a facet single crystal grain structure with a uniform crystal orientation, whilst the first type magnetic layer is free of any facet single crystal grain structure with a uniform crystal orientation.

The fourth present invention provides a spin valve magnetoresistive device including a substrate and a multi-layered structure formed on the substrate. The multi-layered structure comprises a first type magnetic layer which magnetization is free to rotate in accordance with an external applied magnetic field, a non-magnetic spacer layer extending on a bottom surface of the first type magnetic film, and a second type magnetic layer extending on a bottom surface of the non-magnetic film so that the first type magnetic layer is separated by the non-magnetic spacer layer from the second type magnetic layer. The second type magnetic layer extends on a top surface of the substrate, wherein the second type magnetic layer has a facet single crystal grain structure with a uniform crystal orientation whilst the first type magnetic layer is free of any facet single crystal grain structure with a uniform crystal orientation.

The fifth present invention provides a spin valve magnetoresistive device including a substrate and a multi-layered structure formed on the substrate. The multi-layered structure comprises a first type magnetic layer which magnetization is free to rotate in accordance with an external applied magnetic field, a non-magnetic spacer layer extending on a bottom surface of the first type magnetic film, a second type magnetic layer extending on a bottom surface of the non-magnetic film so that the first type magnetic layer is separated by the non-magnetic spacer layer from the second type magnetic layer, and a ferromagnetic layer extending on a bottom surface of the second type magnetic layer. The ferromagnetic layer extends on a top surface of the substrate, wherein the ferromagnetic layer has a facet single crystal grain structure with a uniform crystal orientation whilst the first type magnetic layer is free of any facet single crystal grain structure with a uniform crystal orientation.

The sixth present invention provides a spin valve magnetoresistive device including a substrate and a multi-layered structure formed on the substrate. The multi-layered structure comprises a first type magnetic layer which magnetization is free to rotate in accordance with an external applied magnetic field, a non-magnetic spacer layer extending on a bottom surface of the first type magnetic film, a second type magnetic layer extending on a bottom surface of the non-magnetic film so that the first type magnetic layer is separated by the non-magnetic spacer layer from the second type magnetic layer, and a non-magnetic layer extending on a bottom surface of the second type magnetic layer. The non-magnetic layer extends on a top surface of the substrate, wherein the non-magnetic layer has a facet single crystal grain structure with a uniform crystal orientation, whilst the first type magnetic layer is free of any facet single crystal grain structure with a uniform crystal orientation.

BRIEF DESCRIPTIONS OF THE DRAWINGS

Preferred embodiments according to the present invention will be described in detail with reference to the accompanying drawings.

DISCLOSURE OF THE INVENTION

The first present invention provides a spin valve magnetoresistive multi-layered structure including a first type magnetic layer which magnetization is free to rotate in accordance with an external applied magnetic field, a non-magnetic spacer layer adjacent to said first type magnetic film, and a second type magnetic layer adjacent to said non-magnetic film so that said first type magnetic layer is separated by said non-magnetic spacer layer from said second type magnetic layer, wherein said second type magnetic layer has a facet single crystal grain structure with a uniform crystal orientation whilst the first type magnetic layer is free of any facet single crystal grain structure with a uniform crystal orientation.

Figure 3:
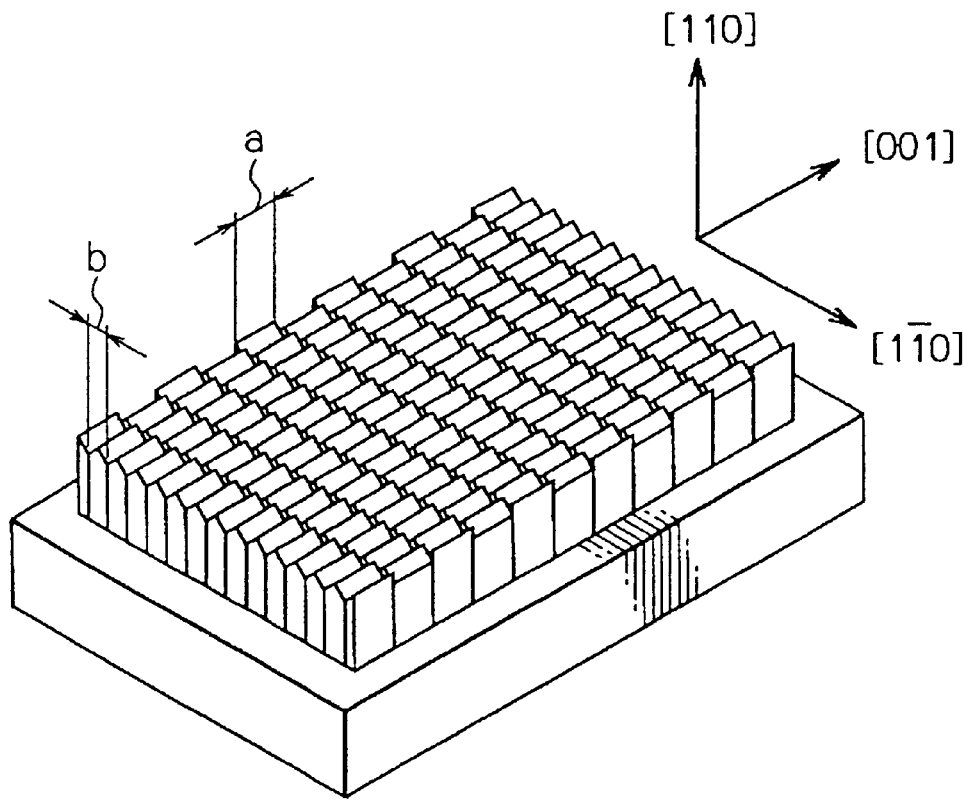
FIG. 3 is a perspective view illustrative of a facet single crystal grain structure appearing on a surface of a body-centered cubic crystal structure epitaxially grown in a [110] direction.

The facet single crystal grain structure with a uniform crystal orientation means a single crystal structure being epitaxially grown in a uniform direction and having a facet surface comprising a plurality of pairs of sloped terraces bounded by a ridge in the form of undulations. Each facet crystal grain has a pair of sloped terraces bounded by a ridge in the form of an undulation. FIG. 3 is a perspective view illustrative of a facet single crystal grain structure appearing on a surface of a body-centered cubic crystal structure epitaxially grown in a [110] direction. If the facet crystal grain having a facet surface with undulations are formed in the initial stage for epitaxial growth, then the undulations of the facet surface of the facet crystal grains becomes large thereby forming a plurality of roofs each of which comprises a pair of sloped terraces bounded by a ridge as well illustrated in FIG. 3. Each facet crystal grain has a roof comprising a pair of sloped terraces bounded by a ridge. Since the facet crystal grains are epitaxially grown, the ridges bounding the paired sloped terraces are uniformly directed or ordered in parallel to a crystal orientation. The size of each of the facet crystal grains is defined by both a longitudinal length "a" in a direction along the ridge bounding the paired sloped terraces in the form of the single roof and a transverse length "b" in a vertical direction to the ridge. The longitudinal and transverse lengths "a" and "b" of each the facet crystal grains are varied depending upon epitaxial growth conditions and thickness of the layer, but may be considered to be almost uniform in the average. The uniformity both in the crystal orientation or the direction of the ridges and in the sizes of the facet crystal grains results in substantially and periodically uniform undulations comprising the plural roofs, each of which comprises a pair of the sloped terraces bounded by the ridge.

It is very important that each facet crystal grain is sharp-pointed or tapered, for example, by the sloped terraces bounded by the one-dimensional ridge as illustrated in FIG. 3, because each of the facet crystal grains in the second type magnetic layer performs as a single magnetic domain thereby resulting in an extremely large coercive force of the second type magnetic layer which has an extremely large force to pin magnetization of the second type magnetic layer. As a result, the second type magnetic layer has the pinned magnetization which is hard to rotate even under a large magnetic field externally applied.

For the above first present invention, it is preferable that each crystal grain of said facet single crystal grain structure in said second type magnetic layer has a facet surface interfaced with said non-magnetic spacer layer.

For the above first present invention, it is also preferable that each crystal grain of said facet single crystal grain structure in said second type magnetic layer has a facet surface formed on an opposite surface to an interface with said non-magnetic spacer layer.

For the above first present invention, it is also preferable that the second type magnetic layer comprises a ferromagnetic metal having a body-centered cubic lattice structure epitaxially grown in a [110] direction so that each crystal grain of the facet single crystal grain structure has a facet surface which comprises a pair of sloped terraces bounded by a ridge which is parallel to a <001> direction in a (110) plane and the crystal grains of the facet single crystal grain structure are periodically aligned in a <110> direction in the (110) plane.

For the above first present invention, it is also preferable that the second type magnetic layer comprises a ferromagnetic metal alloy having a body-centered cubic lattice structure epitaxially grown in a [110] direction so that each crystal grain of the facet single crystal grain structure has a facet surface which comprises a pair of sloped terraces bounded by a ridge which is parallel to a <001> direction in a (110) plane and the crystal grains of the facet single crystal grain structure are periodically aligned in a <110> direction in the (110) plane.

The second present invention provides a spin valve magnetoresistive multi-layered structure including a first type magnetic layer which magnetization is free to rotate in accordance with an external applied magnetic field, a non-magnetic spacer layer adjacent to the first type magnetic film, a second type magnetic layer adjacent to the non-magnetic film so that the first type magnetic layer is separated by the non-magnetic spacer layer from the second type magnetic layer, and a ferromagnetic layer adjacent to the second type magnetic layer wherein the ferromagnetic layer has a facet single crystal grain structure with a uniform crystal orientation whilst the first type magnetic layer is free of any facet single crystal grain structure with a uniform crystal orientation.

The facet single crystal grain structure with a uniform crystal orientation means a single crystal structure being epitaxially grown in a uniform direction and having a facet surface comprising a plurality of pairs of sloped terraces bounded by a ridge in the form of undulations. Each facet crystal grain has a pair of sloped terraces bounded by a ridge in the form of an undulation. FIG. 3 is a perspective view illustrative of a facet single crystal grain structure appearing on a surface of a body-centered cubic crystal structure epitaxially grown in a [110] direction. If the facet crystal grains having a facet surface with undulations are formed in the initial stage for epitaxial growth, then the undulations of the facet surface of the facet crystal grains becomes large thereby forming a plurality of roofs each of which comprises a pair of sloped terraces bounded by a ridge as well illustrated in FIG. 3. Each facet crystal grain has a roof comprising a pair of sloped terraces bounded by a ridge. Since the facet crystal grains are epitaxially grown, the ridges bounding the paired sloped terraces are uniformly directed or ordered in parallel to a crystal orientation. The size of each of the facet crystal grains is defined by both a longitudinal length "a" in a direction along the ridge bounding the paired sloped terraces in the form of the single roof and a transverse length "b" in a vertical direction to the ridge. The longitudinal and transverse lengths "a" and "b" of each the facet crystal grains are varied depending upon epitaxial growth conditions and thickness of the layer, but may be considered to be almost uniform in the average. The uniformity both in the crystal orientation or the direction of the ridges and in the sizes of the facet crystal grains results in substantially and periodically uniform undulations comprising the plural roofs, each of which comprises a pair of the sloped terraces bounded by the ridge.

It is very important that each facet crystal grain is sharp-pointed or tapered, for example, by the sloped terraces bounded by the one-dimensional ridge as illustrated in FIG. 3, because the second type magnetic layer epitaxially grown on the facet surface of each of the facet crystal grains of the ferromagnetic layer performs as a single magnetic domain thereby resulting in an extremely large coercive force of the second type magnetic layer which has an extremely large force to pin magnetization of the second type magnetic layer. As a result, the second type magnetic layer has the pinned magnetization which is hard to rotate even under a large magnetic field externally applied.

For the above second present invention, it is preferable that each crystal grain of the facet single crystal grain structure in the ferromagnetic layer has a facet surface interfaced with the second type magnetic layer.

For the above second present invention, it is also preferable that the ferromagnetic layer comprises a ferromagnetic metal having a body-centered cubic lattice structure epitaxially grown in a [110] direction so that each crystal grain of the facet single crystal grain structure has a facet surface which comprises a pair of sloped terraces bounded by a ridge which is parallel to a <001> direction in a (110) plane and the crystal grains of the facet single crystal grain structure are periodically aligned in a <110> direction in the (110) plane.

For the above second present invention, it is also preferable that the ferromagnetic layer comprises a ferromagnetic metal alloy having a body-centered cubic lattice structure epitaxially grown in a [110] direction so that each crystal grain of the facet single crystal grain structure has a facet surface which comprises a pair of sloped terraces bounded by a ridge which is parallel to a <001> direction in a (110) plane and the crystal grains of the facet single crystal grain structure are periodically aligned in a <110> direction in the (110) plane.

The third present invention provides a spin valve magnetoresistive multilayered structure including a first type magnetic layer which magnetization is free to rotate in accordance with an external applied magnetic field, a non-magnetic spacer layer adjacent to the first type magnetic film, a second type magnetic layer adjacent to the non-magnetic film so that the first type magnetic layer is separated by the non-magnetic spacer layer from the second type magnetic layer, and a non-magnetic layer adjacent to the second type magnetic layer wherein the non-magnetic layer has a facet single crystal grain structure with a uniform crystal orientation, whilst the first type magnetic layer is free of any facet single crystal grain structure with a uniform crystal orientation.

The facet single crystal grain structure with a uniform crystal orientation means a single crystal structure being epitaxially grown in a uniform direction and having a facet surface comprising a plurality of pairs of sloped terraces bounded by a ridge in the form of undulations. Each facet crystal grain has a pair of sloped terraces bounded by a ridge in the form of an undulation. FIG. 3 is a perspective view illustrative of a facet single crystal grain structure appearing on a surface of a body-centered cubic crystal structure epitaxially grown in a [110] direction. If the facet crystal grains having a facet surface with undulations are formed in the initial stage for epitaxial growth, then the undulations of the facet surface of the facet crystal grains becomes large thereby forming a plurality of roofs each of which comprises a pair of sloped terraces bounded by a ridge as well illustrated in FIG. 3. Each facet crystal grain has a roof comprising a pair of sloped terraces bounded by a ridge. Since the facet crystal grains are epitaxially grown, the ridges bounding the paired sloped terraces are uniformly directed or ordered in parallel to a crystal orientation. The size of each of the facet crystal grains is defined by both a longitudinal length "a" in a direction along the ridge bounding the paired sloped terraces in the form of the single roof and a transverse length "b" in a vertical direction to the ridge. The longitudinal and transverse lengths "a" and "b" of each the facet crystal grains are varied depending upon epitaxial growth conditions and thickness of the layer, but may be considered to be almost uniform in the average. The uniformity both in the crystal orientation or the direction of the ridges and in the sizes of the facet crystal grains results in substantially and periodically uniform undulations comprising the plural roofs, each of which comprises a pair of the sloped terraces bounded by the ridge.

It is very important that each facet crystal grain is sharp-pointed or tapered, for example, by the sloped terraces bounded by the one-dimensional ridge as illustrated in FIG. 3, because the second type magnetic layer epitaxially grown on the facet surface of each of the facet crystal grains of the non-magnetic layer performs as a single magnetic domain thereby resulting in an extremely large coercive force of the second type magnetic layer which has an extremely large force to pin magnetization of the second type magnetic layer. As a result, the second type magnetic layer has the pinned magnetization which is hard to rotate even under a large magnetic field externally applied.

For the above third present invention, it is preferable that each crystal grain of the facet single crystal grain structure in the non-magnetic layer has a facet surface interfaced with the second type magnetic layer.

For the above third present invention, it is also preferable that the non-magnetic layer comprises a non-magnetic metal alloy having a body-centered cubic lattice structure epitaxially grown in a [110] direction so that each crystal grain of the facet single crystal grain structure has a facet surface which comprises a pair of sloped terraces bounded by a ridge which is parallel to a <001> direction in a (110) plane and the crystal grains of the facet single crystal grain structure are periodically aligned in a <110> direction in the (110) plane.

For the above third present invention, it is also preferable that the non-magnetic layer comprises an intermetallic compound having a CsCl type lattice structure epitaxially grown in a [110] direction so that each crystal grain of the facet single crystal grain structure has a facet surface which comprises a pair of sloped terraces bounded by a ridge which is parallel to a <001> direction in a (110) plane and the crystal grains of the facet single crystal grain structure are periodically aligned in a <110> direction in the (110) plane.

The fourth present invention provides a spin. valve magnetoresistive device including a substrate and a multi-layered structure formed on the substrate. The multi-layered structure comprises a first type magnetic layer which magnetization is free to rotate in accordance with an external applied magnetic field, a non-magnetic spacer layer extending on a bottom surface of the first type magnetic film, and a second type magnetic layer extending on a bottom surface of the non-magnetic film so that the first type magnetic layer is separated by the non-magnetic spacer layer from the second type magnetic layer. The second type magnetic layer extends on a top surface of the substrate, wherein the second type magnetic layer has a facet single crystal grain structure with a uniform crystal orientation whilst the first type magnetic layer is free of any facet single crystal grain structure with a uniform crystal orientation.

The facet single crystal grain structure with a uniform crystal orientation means a single crystal structure being epitaxially grown in a uniform direction and having a facet surface comprising a plurality of pairs of sloped terraces bounded by a ridge in the form of undulations. Each facet crystal grain has a pair of sloped terraces bounded by a ridge in the form of an undulation. FIG. 3 is a perspective view illustrative of a facet single crystal grain structure appearing on a surface of a body-centered cubic crystal structure epitaxially grown in a [110] direction. If the facet crystal grains having a facet surface with undulations are formed in the initial stage for epitaxial growth, then the undulations of the facet surface of the facet crystal grains becomes large thereby forming a plurality of roofs each of which comprises a pair of sloped terraces bounded by a ridge as well illustrated in FIG. 3. Each facet crystal grain has a roof comprising a pair of sloped terraces bounded by a ridge. Since the facet crystal grains are epitaxially grown, the ridges bounding the paired sloped terraces are uniformly directed or ordered in parallel to a crystal orientation. The size of each of the facet crystal grains is defined by both a longitudinal length "a" in a direction along the ridge bounding the paired sloped terraces in the form of the single roof and a transverse length "b" in a vertical direction to the ridge. The longitudinal and transverse lengths "a" and "b" of each the facet crystal grains are varied depending upon epitaxial growth conditions and thickness of the layer, but may be considered to be almost uniform in the average. The uniformity both in the crystal orientation or the direction of the ridges and in the sizes of the facet crystal grains results in substantially and periodically uniform undulations comprising the plural roofs, each of which comprises a pair of the sloped terraces bounded by the ridge.

It is very important that each facet crystal grain is sharp-pointed or tapered, for example, by the sloped terraces bounded by the one-dimensional ridge as illustrated in FIG. 3, because each of the facet crystal grains in the second type magnetic layer performs as a single magnetic domain thereby resulting in an extremely large coercive force of the second type magnetic layer which has an extremely large force to pin magnetization of the second type magnetic layer. As a result, the second type magnetic layer has the pinned magnetization which is hard to rotate even under a large magnetic field externally applied.

For the above fourth present invention, it is preferable to further provide a buffer layer inserted between the second type magnetic layer and the substrate.

For the above fourth present invention, it is also preferable that each crystal grain of the facet single crystal grain structure in the second type magnetic layer has a facet surface interfaced with the non-magnetic spacer layer.

For the above fourth present invention, it is also preferable that each crystal grain of the facet single crystal grain structure in the second type magnetic layer has a facet surface formed on an opposite surface to an interface with the non-magnetic spacer layer.

For the above fourth present invention, it is also preferable that the second type magnetic layer comprises a ferromagnetic metal having a body-centered lattice structure epitaxially grown in a [110] direction so that each crystal grain of the facet single crystal grain structure has a facet surface which comprises a pair of sloped terraces bounded by a ridge which is parallel to a <001> direction in a (110) plane and the crystal grains of the facet single crystal grain structure are periodically aligned in a <110> direction in the (110) plane.

For the above fourth present invention, it is also preferable that the second type magnetic layer comprises a ferromagnetic metal alloy having a body-centered lattice structure epitaxially grown in a [110] direction so that each crystal grain of the facet single crystal grain structure has a facet surface which comprises a pair of sloped terraces bounded by a ridge which is parallel to a <001> direction in a (110) plane and the crystal grains of the facet single crystal grain structure are periodically aligned in a <110> direction in the (110) plane.

For the above fourth present invention, it is also preferable that the substrate comprises a sapphire substrate with a ($11\bar{2}0$) plane.

For the above fourth present invention, it is also preferable that the substrate comprises a magnesium oxide substrate with a (110) plane.

For the above fourth present invention, it is also preferable that the substrate comprises a quartz substrate with a ($11\bar{2}0$) plane.

The fifth present invention provides a spin valve magnetoresistive device including a substrate and a multi-layered structure formed on the substrate. The multi-layered structure comprises a first type magnetic layer which magnetization is free to rotate in accordance with an external applied magnetic field, a non-magnetic spacer layer extending on a bottom surface of the first type magnetic film, a second type magnetic layer extending on a bottom surface of the non-magnetic film so that the first type magnetic layer is separated by the non-magnetic spacer layer from the second type magnetic layer, and a ferromagnetic layer extending on a bottom surface of the second type magnetic layer. The ferromagnetic layer extends on a top surface of the substrate, wherein the ferromagnetic layer has a facet single crystal grain structure with a uniform crystal orientation whilst the first type magnetic layer is free of any facet single crystal grain structure with a uniform crystal orientation.

The facet single crystal grain structure with a uniform crystal orientation means a single crystal structure being epitaxially grown in a uniform direction and having a facet surface comprising a plurality of pairs of sloped terraces bounded by a ridge in the form of undulations. Each facet crystal grain has a pair of sloped terraces bounded by a ridge in the form of an undulation. FIG. 3 is a perspective view illustrative of a facet single crystal grain structure appearing on a surface of a body-centered cubic crystal structure epitaxially grown in a [110] direction. If the facet crystal grains having a facet surface with undulations are formed in the initial stage for epitaxial growth, then the undulations of the facet surface of the facet crystal grains becomes large thereby forming a plurality of roofs each of which comprises a pair of sloped terraces bounded by a ridge as well illustrated in FIG. 3. Each facet crystal grain has a roof comprising a pair of sloped terraces bounded by a ridge. Since the facet crystal grains are epitaxially grown, the ridges bounding the paired sloped terraces are uniformly directed or ordered in parallel to a crystal orientation. The size of each of the facet crystal grains is defined by both a longitudinal length "a" in a direction along the ridge bounding the paired sloped terraces in the form of the single roof and a transverse length "b" in a vertical direction to the ridge. The longitudinal and transverse lengths "a" and "b" of each the facet crystal grains are varied depending upon epitaxial growth conditions and thickness of the layer, but may be considered to be almost uniform in the average. The uniformity both in the crystal orientation or the direction of the ridges and in the sizes of the facet crystal grains results in substantially and periodically uniform undulations comprising the plural roofs, each of which comprises a pair of the sloped terraces bounded by the ridge.

It is very important that each facet crystal grain is sharp-pointed or tapered, for example, by the sloped terraces bounded by the one-dimensional ridge as illustrated in FIG. 3, because the second type magnetic layer epitaxially grown on the facet surface of each of the facet crystal grains of the ferromagnetic layer performs as a single magnetic domain thereby resulting in an extremely large coercive force of the second type magnetic layer which has an extremely large force to pin magnetization of the second type magnetic layer. As a result, the second type magnetic layer has the pinned magnetization which is hard to rotate even under a large magnetic field externally applied.

For the above fifth present invention, it is preferable to further provide a buffer layer inserted between the ferromagnetic layer and the substrate.

For the above fifth present invention, it is also preferable that each crystal grain of the facet single crystal grain structure in the ferromagnetic layer has a facet surface interfaced with the second type magnetic layer.

For the above fifth present invention, it is also preferable that the ferromagnetic layer comprises a ferromagnetic metal having a body-centered cubic lattice structure epitaxially grown in a [110] direction so that each crystal grain of the facet single crystal grain structure has a facet surface which comprises a pair of sloped terraces bounded by a ridge which is parallel to a <001> direction in a (110) plane and the crystal grains of the facet single crystal grain structure are periodically aligned in a <110> direction in the (110) plane.

For the above fifth present invention, it is also preferable that the ferromagnetic layer comprises a ferromagnetic metal alloy having a body-centered lattice structure epitaxially grown in a [110] direction so that each crystal grain of the facet single crystal grain structure has a facet surface which comprises a pair of sloped terraces bounded by a ridge which is parallel to a <001> direction in a (110) plane and the crystal grains of the facet single crystal grain structure are periodically aligned in a <110> direction in the (110) plane.

For the above fifth present invention, it is also preferable that the substrate comprises a sapphire substrate with a (11$\bar{2}$0) plane.

For the above fifth present invention, it is also preferable that the substrate comprises a magnesium oxide substrate with a (110) plane For the above fifth present invention, it is also preferable that the substrate comprises a quartz substrate with a (11$\bar{2}$0) plane.

The sixth present invention provides a spin valve magnetoresistive device including a substrate and a multi-layered structure formed on the substrate. The multi-layered structure comprises a first type magnetic layer which magnetization is free to rotate in accordance with an external applied magnetic field, a non-magnetic spacer layer extending on a bottom surface of the first type magnetic film, a second type magnetic layer extending on a bottom surface of the non-magnetic film so that the first type magnetic layer is separated by the non-magnetic spacer layer from the second type magnetic layer, and a non-magnetic layer extending on a bottom surface of the second type magnetic layer. The non-magnetic layer extends on a top surface of the substrate, wherein the non-magnetic layer has a facet single crystal grain structure with a uniform crystal orientation, whilst the first type magnetic layer is free of any facet single crystal grain structure with a uniform crystal orientation.

The facet single crystal grain structure with a uniform crystal orientation means a single crystal structure being epitaxially grown in a uniform direction and having a facet surface comprising a plurality of pairs of sloped terraces bounded by a ridge in the form of undulations. Each facet crystal grain has a pair of sloped terraces bounded by a ridge in the form of an undulation. FIG. 3 is a perspective view illustrative of a facet single crystal grain structure appearing on a surface of a body-centered cubic crystal structure epitaxially grown in a [110] direction. If the facet crystal grains having a facet surface with undulations are formed in the initial stage for epitaxial growth, then the undulations of the facet surface of the facet crystal grains becomes large thereby forming a plurality of roofs each of which comprises a pair of sloped terraces bounded by a ridge as well illustrated in FIG. 3. Each facet crystal grain has a roof comprising a pair of sloped terraces bounded by a ridge. Since the facet crystal grains are epitaxially grown, the ridges bounding the paired sloped terraces are uniformly directed or ordered in parallel to a crystal orientation. The size of each of the facet crystal grains is defined by both a longitudinal length "a" in a direction along the ridge bounding the paired sloped terraces in the form of the single roof and a transverse length "b" in a vertical direction to the ridge. The longitudinal and transverse lengths "a" and "b" of each the facet crystal grains are varied depending upon epitaxial growth conditions and thickness of the layer, but may be considered to be almost uniform in the average. The uniformity both in the crystal orientation or the direction of the ridges and in the sizes of the facet crystal grains results in substantially and periodically uniform undulations comprising the plural roofs, each of which comprises a pair of the sloped terraces bounded by the ridge.

It is very important that each facet crystal grain is sharp-pointed or tapered, for example, by the sloped terraces bounded by the one-dimensional ridge as illustrated in FIG. 3, because the second type magnetic layer epitaxially grown on the facet surface of each of the facet crystal grains of the non-magnetic layer performs as a single magnetic domain thereby resulting in an extremely large coercive force of the second type magnetic layer which has an extremely large force to pin magnetization of the second type magnetic layer. As a result, the second type magnetic layer has the pinned magnetization which is hard to rotate even under a large magnetic field externally applied.

For the above sixth present invention, it is preferable to further provide a buffer layer inserted between the non-magnetic layer and the substrate.

For the above sixth present invention, it is also preferable that each crystal grain of the facet single crystal grain structure in the non-magnetic layer has a facet surface interfaced with the second type magnetic layer.

For the above sixth present invention, it is also preferable that the non-magnetic layer comprises a non-magnetic metal alloy having a body-centered cubic lattice structure epitaxially grown in a [110] direction so that each crystal grain of the facet single crystal grain structure has a facet surface which comprises a pair of sloped terraces bounded by a ridge which is parallel to a <001> direction in a (110) plane and the crystal grains of the facet single crystal grain structure are periodically aligned in a <110> direction in the (110) plane.

For the above sixth present invention, it is also preferable that the non-magnetic layer comprises an intermetallic compound having a CsCl type lattice structure epitaxially grown in a [110] direction so that each crystal grain of the facet single crystal grain structure has a facet surface which comprises a pair of sloped terraces bounded by a ridge which is parallel to a <001> direction in a (110) plane and the crystal grains of the facet single crystal grain structure are periodically aligned in a <110> direction in the (110) plane.

For the above sixth present invention, it is also preferable that the substrate comprises a sapphire substrate with a (11$\bar{2}$0) plane.

For the above sixth present invention, it is also preferable that the substrate comprises a magnesium oxide substrate with a (110) plane.

For the above sixth present invention, it is also preferable that the substrate comprises a quartz substrate with a (11$\bar{2}$0) plane.

PREFERRED EMBODIMENTS

First Embodiment

Figure 1:
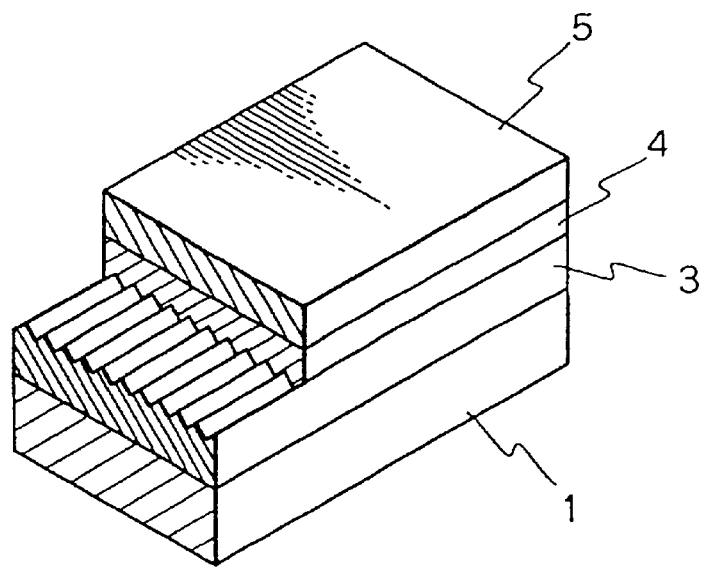
FIG. 1 is a perspective view illustrative of a spin valve magnetoresistive device formed on a substrate in a first embodiment according to the present invention.
Figure 2:
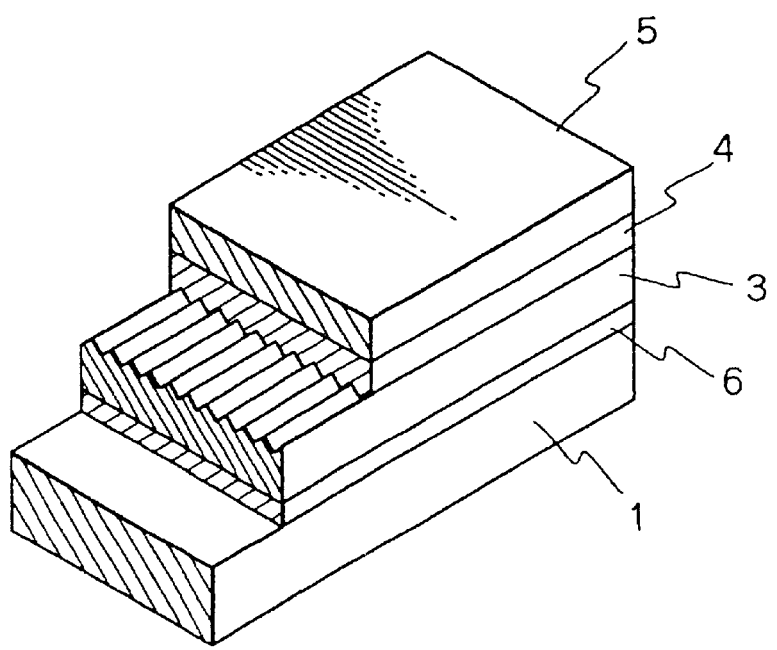
FIG. 2 is a perspective view illustrative of a spin valve magnetoresistive device formed on a buffer layer formed on a substrate in a modification to a first embodiment according to the present invention.

A first embodiment according to the present invention will be described as follows. FIG. 1 is a perspective view illustrative of a spin valve magnetoresistive device formed on a substrate in a first embodiment according to the present invention. FIG. 2 is a perspective view illustrative of a spin valve magnetoresistive device formed on a buffer layer formed on a substrate in a modification to a first embodiment according to the present invention.

As illustrated in FIG. 1, a spin valve magnetoresistive device is formed on a substrate 1. The substrate 1 may comprise a sapphire substrate with a (11$\bar{2}$0) plane. Alternatively, the substrate 1 may also comprise a magnesium oxide substrate with a (110) plane. Further alternatively, the substrate 1 may also comprise a quartz substrate with a (11$\bar{2}$0) plane. The spin valve magnetoresistive device has a multilayered structure which comprises a first type magnetic layer 5 which magnetization is free to rotate in accordance with an external applied magnetic field, a non-magnetic spacer layer 4 extending on a bottom surface of the first type magnetic film 5, and a second type magnetic layer 3 extending on a bottom surface of the non-magnetic film 4 so that the first type magnetic layer 5 is separated by the non-magnetic spacer layer 4 from the second type magnetic layer 3. The second type magnetic layer 3 extends on a top surface of the substrate 1. The second type magnetic layer 3 has a facet single crystal grain structure with a uniform crystal orientation whilst the first type magnetic layer is free of any facet single crystal grain structure with a uniform crystal orientation. Each crystal grain of the facet single crystal grain structure in the second type magnetic layer 3 has a facet surface interfaced with the non-magnetic spacer layer. The second type magnetic layer 3 comprises a ferromagnetic metal or a ferromagnetic metal alloy having a body-centered cubic lattice structure epitaxially grown in a [110] direction so that each crystal grain of the facet single crystal grain structure has a facet surface which comprises a pair of sloped terraces bounded by a ridge which is parallel to a <001> direction in a (110) plane and the crystal grains of the facet single crystal grain structure are periodically aligned in a <110> direction in the (110) plane. The second type magnetic layer 3 may, for example, be made of Fe, Fe—Co alloy, Fe—Si alloy, Fe—V alloy, or other Fe-based alloys. The non-magnetic spacer layer 4 may have a cubit system crystal structure or a hexagonal system crystal structure. The first type magnetic layer 5 has no facet crystal grains but has a uniform crystal orientation. The non-magnetic spacer layer 4 may be made of Cu, Au, or Ag in the form of a face-centered cubic crystal system, or Ti or Ru in the form of hexagonal system, or an alloy system thereof. On the body-centered cubic crystal structure of the second magnetic layer 3 having the facet crystal grains with the uniform crystal orientation, the non-magnetic spacer layer is epitaxially grown in a (111) plane of the face-centered cubic system or grown in a (0001) plane of the hexagonal system. The surface of the grown non-magnetic spacer layer is flat. The non-magnetic spacer layer 4 has a thickness in the range of 2–6 nanometers to prevent appearance of exchange-coupling between the first and second type magnetic layers 5 and 3. The first type magnetic layer 5 may comprise Fe, Co, Ni, Ni—Fe, Ni—Fe—Co, Fe—Al—Si, or Co-based amorphous alloy soft magnetic layers. There is no particular limitation to the thickness of the first and second type magnetic layers 5 and 3. Notwithstanding, it might be preferable that the thickness of each the first and second type magnetic layers 5 and 3 is in the range of 0.4 nanometers to 30 nanometers in consideration with the facts that it is difficult to obtain a uniform thickness of less than 0.4 nanometers and a larger thickness exceeding 30 nanometers is not necessary.

Figure 4:
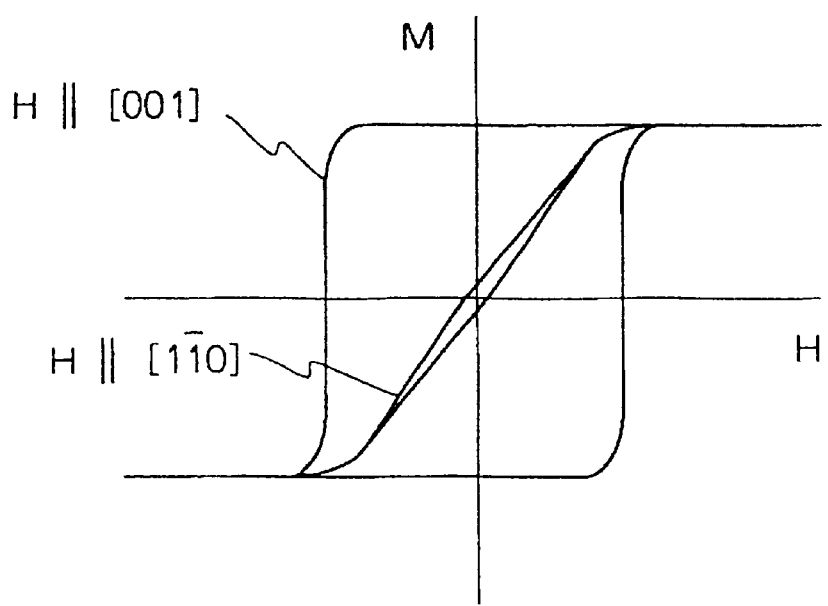
FIG. 4 is a diagram illustrative of a magnetization hysteresis loop to describe facet crystal grains in accordance with the present invention.

The facet single crystal grain structure with a uniform crystal orientation means a single crystal structure being epitaxially grown in a uniform direction and having a facet surface comprising a plurality of pairs of sloped terraces bounded by a ridge in the form of undulations. Each. facet crystal grain has a pair of sloped terraces bounded by a ridge in the form of an undulation. FIG. 3 is a perspective view illustrative of a facet single crystal grain structure appearing on a surface of a body-centered cubic crystal structure epitaxially grown in a [110] direction. If the facet crystal grains having a facet surface with undulations are formed in the initial stage for epitaxial growth, then the undulations of the facet surface of the facet crystal grains becomes large thereby forming a plurality of roofs each of which comprises a pair of sloped terraces bounded by a ridge as well illustrated in FIG. 3. Each facet crystal grain has a roof comprising a pair of sloped terraces bounded by a ridge. Since the facet crystal grains are epitaxially grown, the ridges bounding the paired sloped terraces are uniformly directed or ordered in parallel to a crystal orientation. The second type magnetic layer 3 comprises a ferromagnetic metal or a ferromagnetic metal alloy having a body-centered cubic lattice structure epitaxially grown in a [110] direction so that each crystal grain of the facet single crystal grain structure has a facet surface which comprises a pair of sloped terraces bounded by a ridge which is parallel to a <001> direction in a (110) plane and the crystal grains of the facet single crystal grain structure are periodically aligned in a <110> direction in the (110) plane. The size of each of the facet crystal grains is defined by both a longitudinal length "a" in a direction along the ridge bounding the paired sloped terraces in the form of the single roof and a transverse length "b" in a vertical direction to the ridge. The uniformity both in the crystal orientation or the direction of the ridges and in the sizes of the facet crystal grains results in substantially and periodically uniform undulations comprising the plural roofs, each of which comprises a pair of the sloped terraces bounded by the ridge. The longitudinal and transverse lengths "a" and "b" of each the facet crystal grains are varied depending upon epitaxial growth conditions such as a growth temperature and a growth rate and thickness of the layer, but may be considered to be almost uniform in the average. If, for example, a Fe(110) plane film with a thickness of 50 nanometers is grown by a molecular beam epitaxy method on a (11$\bar{2}$0) plane of a sapphire substrate under a substrate temperature of 100° C. and a growth rate of 0.04 nanometers/second, then facet crystal grains as illustrated in FIG. 3 are formed wherein a mean facet length is 80 nanometers and a facet width is 20 nanometers. Only the second type magnetic layer 3 is patterned in the form of circle by a photo-lithography for subsequent measurement of magnetic torque by a torque magnetometer. It was confirmed that a <100> direction is an easy axis of magnetization whilst a <110> direction vertical to the <100> direction is a hard axis of magnetization. It was also confirmed that a large uniaxial anisotropy of Ku $10^6$ erg/$cm^3$ per unit volume is provided to the (110) plane. If tile magnetic field is applied in the <100> direction along the axis of easy magnetization, then a rectangular magnetic hysteresis loop with a large coercive force whilst if the magnetic field is applied in the <110> direction along the hard axis of magnetization, then the slender looped magnetic hysteresis with a small coercive force is obtained as illustrated in FIG. 4.

It is very important that each facet crystal grain is sharp-pointed or tapered, for example, by the sloped terraces bounded by the one-dimensional ridge as illustrated in FIG. 3, because each of the facet crystal grains in the second type magnetic layer performs as a single magnetic domain thereby resulting in an extremely large coercive force of the second type magnetic layer which has an extremely large force to pin magnetization of the second type magnetic layer. As a result, the second type magnetic layer has the pinned magnetization which is hard to rotate even under a large magnetic field externally applied. The facet crystal grain has a major axis in the <100> direction and a minor axis in the <110> direction. Each of the facet crystal grains in the second type magnetic layer performs as a single magnetic domain. If the magnetic field is applied in the <100> direction along the axis of easy magnetization, then the coercive force Hc is given by Hc=2Ku/Ms where Ku is a unidirectional energy and Ms is a saturation magnetization. If the second type magnetic layer 3 is made of Fe, then Ku=the order of $10^6$ erg/cm$^3$ and Ms is the order of 1700 erg/cm$^3$, and then the coercive force Hc is the order of 1 kOe.

Figure 5:
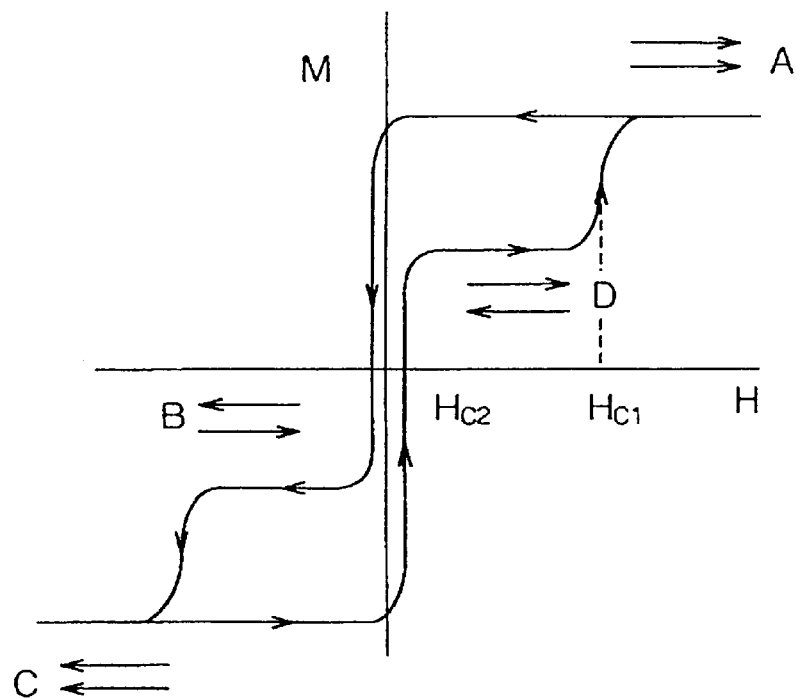
FIG. 5 is a diagram illustrative of a magnetization hysteresis loop to describe facet crystal grains in accordance with the present invention.
Figure 6:
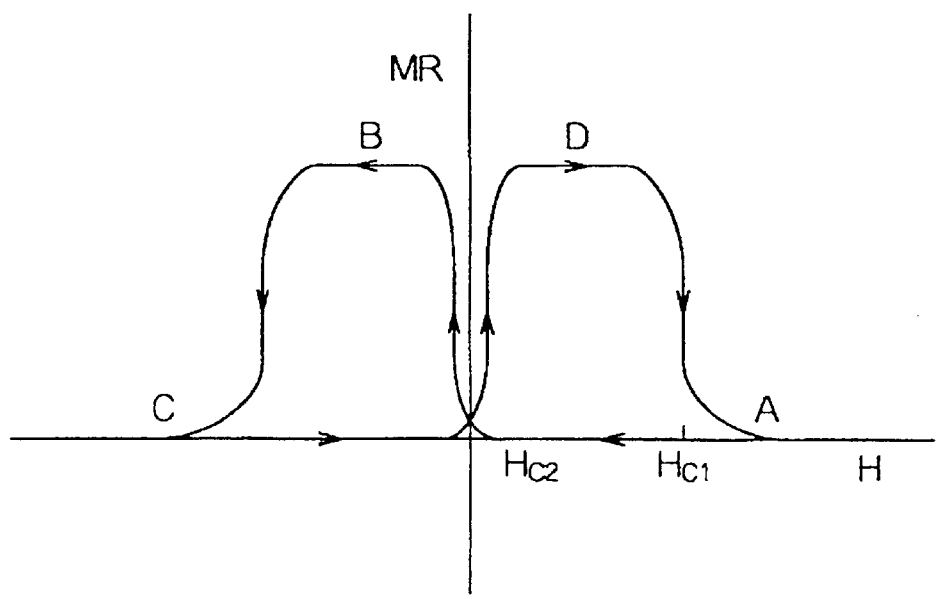
FIG. 6 is a diagram illustrative of a magnetoresistance hysteresis loop to describe facet crystal grains in accordance with the present invention.

If the magnetic field is applied in the <100> direction along the axis of easy magnetization which is parallel to the ridge of the facet, then the magnetization and the magnetoresistance are measured and the measured values are obtained as illustrated in FIGS. 5 and 6. FIG. 5 is a diagram illustrative of a magnetization hysteresis loop to describe facet crystal grains. FIG. 6 is a diagram illustrative of a magnetoresistance hysteresis loop to describe facet crystal grains. In FIGS. 5 and 6, the directions of the magnetization are represented by arrow marks. If a sufficiently large magnetic field is applied in the positive direction, then the magnetization of the first and second type magnetic layers 5 and 3 is ordered (Point "A" in FIGS. 5 and 6). The magnetic domains are unlikely to move due to the facet crystal grains with the uniform orientation. In the magnetic rotation mode, the magnetization is varied. If the external magnetic field is applied in the direction along the easy axis of magnetization, then the magnetization loop showing a larger coercive force Hc1 is obtained. In the state where the magnetization of the first and second magnetic layers 5 and 3 are parallel to each other, the externally applied magnetic field is dropped As the externally applied magnetic field approaches zero and corresponds to a coercive force Hc2 of the first type magnetic layer, then the magnetization of the first type magnetic layer is inverted (Point "B" in FIGS. 5 and 6). If 0>H>—Hc1 where H is the externally applied magnetic field, then the first and second type magnetic layers are anti-paralleled in magnetization. If the magnetic field externally applied is shifted to the negative direction, then the first and second type magnetic layers 5 and 3 are ferromagnetically ordered (Point "C" in FIGS. 5 and 6). If the magnetic field externally applied is then shifted into the positive direction and as the magnetic field approaches zero, then the magnetization is inverted (Point "D" in FIGS. 5 and 6). If 0<H<Hc1 where H is the externally applied magnetic field, then the first and second type magnetic layers 5 and 3 are anti-paralleled in magnetization. If the magnetic field externally applied is further increased in the positive direction, the first and second type magnetic layers 5 and 3 are ferromagnetically ordered in magnetization and the pint is returned to the initial point "A" in FIGS. 5 and 6. Therefore, the magnetization and magnetoresistance hysteresis loops are obtained as illustrated in FIGS. 5 and 6. If the first and second magnetic layers 5 and 3 are anti-paralleled in magnetization, the electrical resistance is high. If the first and second magnetic layers 5 and 3 are paralleled in magnetization, the electrical resistance is low. The magnetoresistance is varied as illustrated in FIG. 6. In the vicinity of zero magnetic field, a rapid change in magnetoresistance appears. The magnetoresistance is kept until near the coercive force of the second type magnetic layer 3 and then rapidly dropped to zero.

As described above, of the second type magnetic layer 3, the magnetization is pinned in the direction along the axis of the easy magnetization whilst the first type magnetic layer 5 separated by the non-magnetic spacer layer 4 from the second type magnetic layer 3 shows no interaction with the second type magnetic layer 3. For this reason, the first type magnetic layer 5 allows the magnetization free to rotate in accordance with the externally applied magnetic field. The above structure allows a spin valve operation of the magnetoresistance device. In order to cause the magnetization of the second type magnetic layer to rotate in the external magnetization direction, if, for example, the unidirectional anisotropy of the order of $10^6$ erg/cm$^3$ is provided to the second type magnetic layer, then a large magnetic field in the order of Hc1=1 kOe is required. The magnetization of the second type magnetic layer 3 is pinned by an apparently large exchange-coupling magnetic field, for which reason even if the above device is applied to a magnetic sensor such as magnetic head, then no rotation of magnetization of the second type magnetic layer 3 is caused and thereby a stable spin valve operation can be realized.

As a modification as illustrated in FIG. 2, it is possible to further provide a buffer layer 6 inserted between the second type magnetic layer and the substrate for relaxation of lattice miss-match between the substrate 1 and the second type magnetic layer 3. The buffer layer 6 may preferably comprise a body-centered cubic crystal structure made of V, Cr, Zr, Nb, Mo, Hf, Ta, W, and alloys thereof The above spin valve magnetoresistive multi-layered structure may be formed by use of a molecular beam epitaxial system (ultra-high vacuum evaporation system). As a deposition source, an electron beam evaporation source is used. The system is provided with an electron gun and a fluorescent screen for reflection high-energy electron diffraction (RHEED) to evaluate the growing surface structure of the respective layers. The used epitaxial growth system is cable of making a vacuum of $1\times10^{-10}$ torr and the epitaxial growth is carried out in the order of $10^{-9}$ torr.

For various samples, the second type magnetic layers 3 are epitaxially grown under various conditions of substrate temperature and growth rate and various thicknesses of the second type magnetic layers 3 over various substrates 1. The second type magnetic layer has the body-centered crystal structure having facet crystal grains. Of each the facet crystal grain, the facet mean length "a" defined as the majority facet size in the direction along the ridge and the facet mean width "b" defined as the minority facet size in the direction vertical to the direction along the ridge are measured by an atomic force microscope (AFM). The results of measurements are represented as follows. Sample Nos. #10–12 have a buffer layer 6 inserted between the substrate 1 and the second type magnetic layer 3 for relaxation of lattice miss-match between the substrate 1 and the second type magnetic layer 3. The buffer layer 6 has a thickness of 3 nanometers and is made of Nb. The buffer layer 6 is grown under conditions of a substrate temperature of $T_B$=900° C., and a growth rate of 0.4 nanometers/second. If the buffer layer 6 made of V, Cr, Zr, Nb, Mo, Hf, Ta, W, V—Cr alloy, Nb—Ta alloy, Mo—Zr alloy, or Hf—W alloy is used, then the results are almost the same as those of the sample No. #10.

Over the second type magnetic layer 3, at room temperature, a non-magnetic spacer layer 4 having a thickness of 3 nanometers is grown. Further, a first type magnetic layer 5 having a thickness of 5 nanometers is formed over the non-magnetic spacer layer 4. The grown layers are then patterned by photo-lithography for measurement of magnetoresistance by a direct current four-probe method under a magnetic field of until 1.5 kOe at room temperature. Measured is a magnetic field Hc1 at which the magnetization of the ferromagnetic layer of the body-centered crystal structure is inverted. Also measured is a magnetic field Hc2 at which the magnetization of the first type magnetic layer 5 is inverted. A magnetoresistance MR ratio is also measured.

Sample No. #1:

A Fe magnetic layer 3 having a thickness of 50 nanometers is epitaxially grown on a ($11\bar{2}0$) plane of an $Al_2O_3$ substrate at a substrate temperature of 100° C. and a growth rate of 0.04 nanometers/second. The measured facet mean length is 80 nanometers and the measured facet mean width is 20 nanometers. A Cu non-magnetic spacer layer 4 having a thickness of 3 nanometers is grown at room temperature on the magnetic layer 3. A Fe magnetic layer 5 having a thickness of 5 nanometers is formed over the non-magnetic spacer layer 4. The grown layers are then patterned by photo-lithography for measurement of magnetoresistance by a direct current four-probe method under a magnetic field of until 1.5 kOe at room temperature. The measured magnetic field Hc1 is 900 Oe. The measured magnetic field Hc2 is 10 Oe. The measured magnetoresistance MR ratio is 8%.

Sample No. #2:

A Fe magnetic layer 3 having a thickness of 50 nanometers is epitaxially grown on a ($11\bar{2}0$) plane of an $Al_2O_3$ substrate at a substrate temperature of −50° C. and a growth rate of 0.01 nanometers/second. The measured facet mean length is 30 nanometers and the measured facet mean width is 10 nanometers. A Cu non-magnetic spacer layer 4 having a thickness of 3 nanometers is grown at room temperature on the magnetic layer 3. A Fe magnetic layer 5 having a thickness of 5 nanometers is formed over the non-magnetic spacer layer 4. The grown layers are then patterned by photo-lithography for measurement of magnetoresistance by a direct current four-probe method under a magnetic field of until 1.5 kOe at room temperature. The measured magnetic field Hc1 is 950 Oe. The measured magnetic field Hc2 is 20 Oe. The measured magnetoresistance MR ratio is 6%.

Sample No. #3:

A $Fe_{50}Co_{50}$ magnetic layer 3 having a thickness of 30 nanometers is epitaxially grown on a ($11\bar{2}0$) plane of an $Al_2O_3$ substrate at a substrate temperature of 30° C. and a growth rate of 0.02 nanometers/second. The measured facet mean length is 70 nanometers and the measured facet mean width is 15 nanometers. An Ag non-magnetic spacer layer 4 having a thickness of 3 nanometers is grown at room temperature on the magnetic layer 3. A Ni magnetic layer 5 having a thickness of 5 nanometers is formed over the non-magnetic spacer layer 4. The grown layers are then patterned by photo-lithography for measurement of magnetoresistance by a direct current four-probe method under a magnetic field of until 1.5 kOe at room temperature. The measured magnetic field Hc1 is 950 Oe. The measured magnetic field Hc2 is 20 Oe. The measured magnetoresistance MR ratio is 8%.

Sample No. #4:

A $Fe_{95}Si_5$ magnetic layer 3 having a thickness of 20 nanometers is epitaxially grown on a ($11\bar{2}0$) plane of an $Al_2O_3$ substrate at a substrate temperature of 30° C. and a growth rate of 0.04 nanometers/second. The measured facet mean length is 60 nanometers and the measured facet mean width is 15 nanometers. A Ti non-magnetic spacer layer 4 having a thickness of 3 nanometers is grown at room temperature on the magnetic layer 3. A $Ni_{81}Fe_{19}$ magnetic layer 5 having a thickness of 5 nanometers is formed over the non-magnetic spacer layer 4. The grown layers are then patterned by photo-lithography for measurement of magnetoresistance by a direct current four-probe method under a magnetic field of until 1.5 kOe at room temperature. The measured magnetic field Hc1 is 950 Oe. The measured magnetic field Hc2 is 5 Oe. The measured magnetoresistance MR ratio is 8%.

Sample No. #5:

A $Fe_{90}V_{10}$ magnetic layer 3 having a thickness of 25 nanometers is epitaxially grown on a ($11\bar{2}0$) plane of an $Al_2O_3$ substrate at a substrate temperature of 30° C. and a growth rate of 0.02 nanometers/second. The measured facet mean length is 70 nanometers and the measured facet mean width is 20 nanometers. A Ru non-magnetic spacer layer 4 having a thickness of 3 nanometers is grown at room temperature on the magnetic layer 3. A $Ni_{66}Fe_{16}Co_{18}$ magnetic layer 5 having a thickness of 5 nanometers is formed over the non-magnetic spacer layer 4. The grown layers are then patterned by photo-lithography for measurement of magnetoresistance by a direct current four-probe method under a magnetic field of until 1.5 kOe at room temperature. The measured magnetic field Hc1 is 850 Oe. The measured magnetic field Hc2 is 4 Oe. The measured magnetoresistance MR ratio is 6%.

Sample No. #6:

A Fe magnetic layer 3 having a thickness of 20 nanometers is epitaxially grown on a (110) plane of an MgO substrate at a substrate temperature of 50° C. and a growth rate of 0.1 nanometers/second. The measured facet mean length is 50 nanometers and the measured facet mean width is 10 nanometers. A Cu non-magnetic spacer layer 4 having a thickness of 3 nanometers is grown at room temperature on the magnetic layer 3. A $Fe_{85}Al_{5.4}Si_{9.6}$ magnetic layer 5 having a thickness of 5 nanometers is formed over the non-magnetic spacer layer 4. The grown layers are then patterned by photo-lithography for measurement of magnetoresistance by a direct current four-probe method under a magnetic field of until 1.5 kOe at room temperature. The measured magnetic field Hc1 is 900 Oe. The measured magnetic field Hc2 is 2 Oe. The measured magnetoresistance MR ratio is 5%.

Sample No. #7:

A $Fe_{50}Co_{50}$ magnetic layer 3 having a thickness of 30 nanometers is epitaxially grown on a (110) plane of an MgO substrate at a substrate temperature of 100° C. and a growth rate of 0.1 nanometers/second. The measured facet mean length is 50 nanometers and the measured facet mean width is 10 nanometers. A Cu non-magnetic spacer layer 4 having a thickness of 3 nanometers is grown at room temperature on the magnetic layer 3. An a-CoZr magnetic layer 5 having a thickness of 5 nanometers is formed over the non-magnetic spacer layer 4. The grown layers are then patterned by photo-lithography for measurement of magnetoresistance by a direct current four-probe method under a magnetic field of until 1.5 kOe at room temperature. The measured magnetic field Hc1 is 900 Oe. The measured magnetic field Hc2 is 2 Oe. The measured magnetoresistance MR ratio is 4%.

Sample No. #8:

A Fe magnetic layer 3 having a thickness of 25 nanometers is epitaxially grown on a ($11\bar{2}0$) plane of an $SiO_2$ substrate at a substrate temperature of 30° C. and a growth rate of 0.1 nanometers/second. The measured facet mean length is 50 nanometers and the measured facet mean width is 10 nanometers. A Cu non-magnetic spacer layer 4 having a thickness of 3 nanometers is grown at room temperature on the magnetic layer 3. A $Ni_{81}Fe_{19}$ magnetic layer 5 having a thickness of 5 nanometers is formed over the non-magnetic spacer layer 4. The grown layers are then patterned by photo-lithography for measurement of magnetoresistance by a direct current four-probe method under a magnetic field of until 1.5 kOe at room temperature. The measured magnetic field Hc1 is 950 Oe. The measured magnetic field Hc2 is 3 Oe. The measured magnetoresistance MR ratio is 5%.

Sample No. #9:

A $Fe_{95}Si_5$ magnetic layer 3 having a thickness of 25 nanometers is epitaxially grown on a $(11\bar{2}0)$ plane of an $SiO_2$ substrate at a substrate temperature of 30° C. and a growth rate of 0.05 nanometers/second. The measured facet mean length is 80 nanometers and the measured facet mean width is 20 nanometers. An Ag non-magnetic spacer layer 4 having a thickness of 3 nanometers is grown at room temperature on the magnetic layer 3. A $Ni_{24}Fe_{15}Co_{61}$ magnetic layer 5 having a thickness of 5 nanometers is formed over the non-magnetic spacer layer 4. The grown layers are then patterned by photo-lithography for measurement of magnetoresistance by a direct current four-probe method under a magnetic field of until 1.5 kOe at room temperature. The measured magnetic field Hc1 is 850 Oe. The measured magnetic field Hc2 is 2 Oe. The measured magnetoresistance MR ratio is 6%.

Sample No. #10:

A $Fe_{50}Co_{50}$ magnetic layer 3 having a thickness of 30 nanometers is epitaxially grown on a $(11\bar{2}0)$ plane of an $A_2O_3$ substrate at a substrate temperature of 30° C. and a growth rate of 0.05 nanometers/second. The measured facet mean length is 50 nanometers and the measured facet mean width is 10 nanometers. A Cu non-magnetic spacer layer 4 having a thickness of 3 nanometers is grown at room temperature on the magnetic layer 3. A $Ni_{81}Fe_{19}$ magnetic layer 5 having a thickness of 5 nanometers is formed over the non-magnetic spacer layer 4. The grown layers are then patterned by photo-lithography for measurement of magnetoresistance by a direct current four-probe method under a magnetic field of until 1.5 kOe at room temperature. The measured magnetic field Hc1 is 850 Oe. The measured magnetic field Hc2 is 3 Oe. The measured magnetoresistance MR ratio is 4%.

Sample No. #11:

A $Fe_{50}Co_{50}$ magnetic layer 3 having a thickness of 25 nanometers is epitaxially grown on a (110) plane of an MgO substrate at a substrate temperature of 30° C. and a growth rate of 0.06 nanometers/second. The measured facet mean length is 40 nanometers and the measured facet mean width is 10 nanometers. A Cu non-magnetic spacer layer 4 having a thickness of 3 nanometers is grown at room temperature on the magnetic layer 3. A $Ni_{81}Fe_{19}$ magnetic layer 5 having a thickness of 5 nanometers is formed over the non-magnetic spacer layer 4. The grown layers are then patterned by photo-lithography for measurement of magnetoresistance by a direct current four-probe method under a magnetic field of until 1.5 kOe at room temperature. The measured magnetic field Hc1 is 800 Oe. The measured magnetic field Hc2 is 3 Oe. The measured magnetoresistance MR ratio is 3%.

Sample No. #12:

A $Fe_{50}Co_{50}$ magnetic layer 3 having a thickness of 20 nanometers is epitaxially grown on a $(11\bar{2}0)$ plane of an $SiO_2$ substrate at a substrate temperature of 30° C. and a growth rate of 0.04 nanometers/second. The measured facet mean length is 40 nanometers and the measured facet mean width is 10 nanometers. A Cu non-magnetic spacer layer 4 having a thickness of 3 nanometers is grown at room temperature on the magnetic layer 3. A $Ni_{81}Fe_{19}$ magnetic layer 5 having a thickness of 5 nanometers is formed over the non-magnetic spacer layer 4. The grown layers are then patterned by photo-lithography for measurement of magnetoresistance by a direct current four-probe method under a magnetic field of until 1.5 kOe at room temperature. The measured magnetic field Hc1 is 850 Oe. The measured magnetic field Hc2 is 3 Oe. The measured magnetoresistance MR ratio is 4%.

Comparative Sample No. #1:

A $Fe_{50}Co_{50}$ magnetic layer 3 free of facet crystal grain and having a thickness of 3 nanometers is epitaxially grown on a glass substrate. A Cu non-magnetic spacer layer 4 having a thickness of 2.5 nanometers is grown at room temperature on the magnetic layer 3. A $Ni_{81}Fe_{19}$ magnetic layer 5 having a thickness of 3 nanometers is formed over the non-magnetic spacer layer 4. The grown layers are then patterned by photo-lithography for measurement of magnetoresistance by a direct current four-probe method under a magnetic field of until 1.5 kOe at room temperature. The measured magnetic field Hc1 is 50 Oe. The measured magnetic field Hc2 is 5 Oe. The measured magnetoresistance MR ratio is 5%.

Second Embodiment

Figure 7:
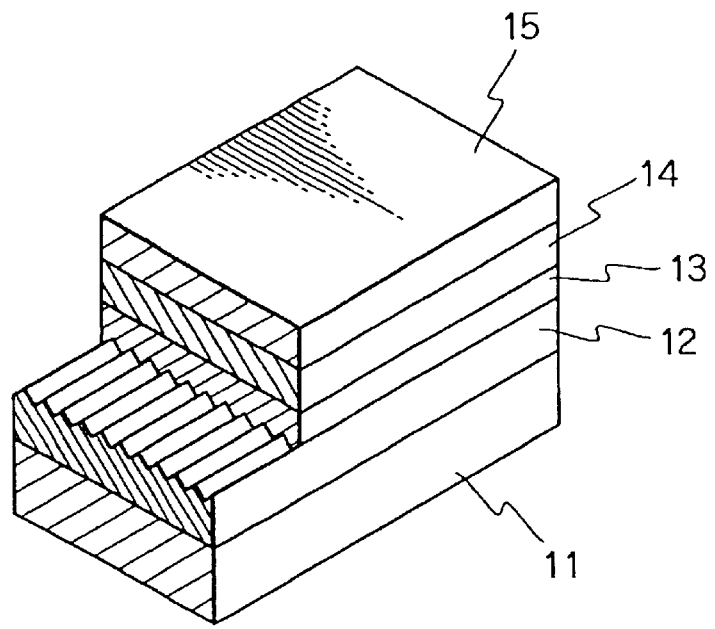
FIG. 7 is a perspective view illustrative of a spin valve magnetoresistive device formed on a substrate in a second embodiment according to the present invention.
Figure 8:
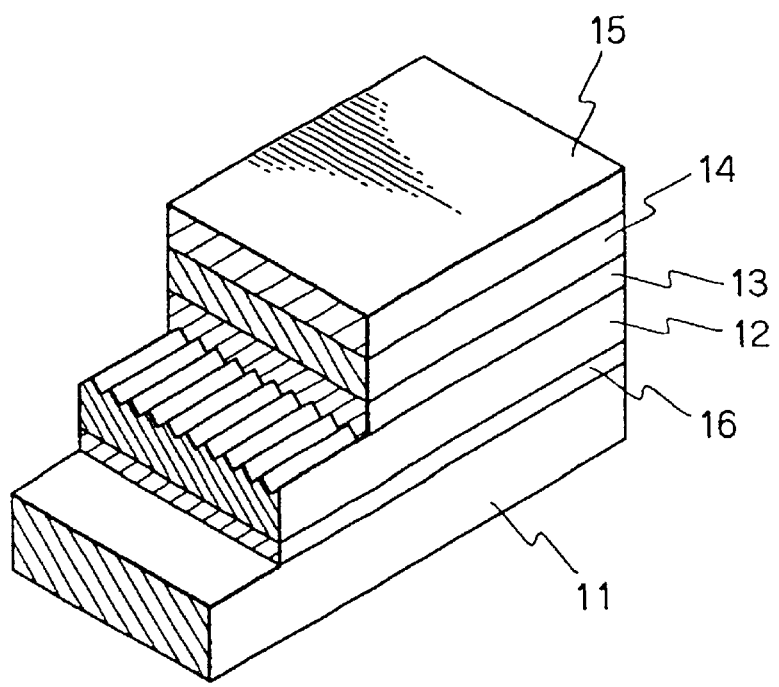
FIG. 8 is a perspective view illustrative of a spin valve magnetoresistive device formed on a buffer layer formed on a substrate in a modification to a second embodiment according to the present invention.

A second embodiment according to the present invention will be described as follows. FIG. 7 is a perspective view illustrative of a spin valve magnetoresistive device formed on a substrate in a second embodiment according to the present invention. FIG. 8 is a perspective view illustrative of a spin valve magnetoresistive device formed on a buffer layer formed on a subtract in a modification to a second embodiment according to the present invention.

As illustrated in FIG. 7, a spin valve magnetoresistive device is formed on a substrate 11. The substrate 11 may comprise a sapphire substrate with a $(11\bar{2}0)$ plane. Alternatively, the substrate 11 may also comprise a magnesium oxide substrate with a (110) plane. Further alternatively, the substrate 11 may also comprise a quartz substrate with a $(11\bar{2}0)$ plane. The spin valve magnetoresistive device has a multi-layered structure which comprises a first type magnetic layer 15 which magnetization is free to rotate in accordance with an external applied magnetic field, a non-magnetic spacer layer 14 extending on a bottom surface of the first type magnetic film 15, a second type magnetic layer 13 extending on a bottom surface of the non-magnetic film 14 so that the first type magnetic layer 15 is separated by the non-magnetic spacer layer 14 from the second type magnetic layer 13, and a ferromagnetic layer 12 extending on a bottom surface of the second type magnetic layer 13. The ferromagnetic layer 12 extends on a top surface of the substrate 11. The second type magnetic layer 13 epitaxially grown on a facet surface of the ferromagnetic layer 12 also has a facet single crystal grain structure with a uniform crystal orientation whilst the first type magnetic layer is free of any facet single crystal grain structure with a uniform crystal orientation. Each crystal grain of the facet single crystal grain structure in the second type magnetic layer 13 has a facet surface interfaced with the ferromagnetic layer 12. The ferromagnetic layer 12 comprises a ferromagnetic metal or a ferromagnetic metal alloy having a body-centered cubic lattice structure epitaxially grown in a [110] direction so that each crystal grain of the facet single crystal grain structure has a facet surface which comprises a pair of sloped terraces bounded by a ridge which is parallel to a <001> direction in a (110) plane and the crystal grains of the facet single crystal grain structure are periodically aligned in a <110> direction in the (110) plane. The ferromagnetic layer 12 may, for example, be made of Fe, Fe—Co alloy, Fe-based alloys. The second type magnetic layer 13 may, for example, be made of Fe, Fe—Co alloy, Fe-based alloys in the form of a body-centered lattice structure. Alternatively, the second type magnetic layer 13 may, for example, be made of Ni, Ni—Fe based alloy in the form of face-centered lattice structure or Co, Co—Cr—Ta alloy, Co—Pt alloy in the form of hexagonal lattice structure or rare earth metal/cobalt-based intermetallic compounds. The non-magnetic spacer layer 14 may be made of Cu, Au, Ag in the form of cubit system lattice structure or Ti, Ru in the form of hexagonal system lattice structure. The first type magnetic layer 15 has no facet crystal grains but has a uniform crystal orientation. The non-magnetic spacer layer 14 has a thickness in the range of 2–6 nanometers to prevent appearance of exchange-coupling between the first and second type magnetic layers 15 and 13. The first type magnetic layer 15 may comprise Fe, Co, Ni, Ni—Fe, Ni—Fe—Co, Fe—Al—Si, or Co-based amorphous alloy soft magnetic layers. There is no particular limitation to the thickness of the first and second type magnetic layers 15 and 13. Notwithstanding, it might be preferable that the thickness of each the first and second type magnetic layers 15 and 13 is in the range of 0.4 nanometers to 30 nanometers in consideration with the facts that it is difficult to obtain a uniform thickness of less than 0.4 nanometers and a larger thickness exceeding 30 nanometers is not necessary.

The facet single crystal grain structure with a uniform crystal orientation means a single crystal structure being epitaxially grown in a uniform direction and having a facet surface comprising a plurality of pairs of sloped terraces bounded by a ridge in the form of undulations. Each facet crystal grain has a pair of sloped terraces bounded by a ridge in the form of an undulation. FIG. 3 is a perspective view illustrative of a facet single crystal grain structure appearing on a surface of a body-centered cubic crystal structure epitaxially grown in a [110] direction. If the facet crystal grains having a facet surface with undulations are formed in the initial stage for epitaxial growth, then the undulations of the facet surface of the facet crystal grains becomes large thereby forming a plurality of roofs each of which comprises a pair of sloped terraces bounded by a ridge as well illustrated in FIG. 3. Each facet crystal grain has a roof comprising a pair of sloped terraces bounded by a ridge. Since the facet crystal grains are epitaxially grown, the ridges bounding the paired sloped terraces are uniformly directed or ordered in parallel to a crystal orientation. The second type magnetic layer 13 comprises a ferromagnetic metal or a ferromagnetic metal alloy having a body-centered cubic lattice structure epitaxially grown in a [110] direction so that each crystal grain of the facet single crystal grain structure has a facet surface which comprises a pair of sloped terraces bounded by a ridge which is parallel to a <001> direction in a (110) plane and the crystal grains of the facet single crystal grain structure are periodically aligned in a <110> direction in the (110) plane. The size of each of the facet crystal grains is defined by both a longitudinal length "a" in a direction along the ridge bounding the paired sloped terraces in the form of the single roof and a transverse length "b" in a vertical direction to the ridge. The uniformity both in the crystal orientation or the direction of the ridges and in the sizes of the facet crystal grains results in substantially and periodically uniform undulations comprising the plural roofs, each of which comprises a pair of the sloped terraces bounded by the ridge. The longitudinal and transverse lengths "a" and "b" of each the facet crystal grains are varied depending upon epitaxial growth conditions such as a growth temperature and a growth rate and thickness of the layer, but may be considered to be almost uniform in the average. Only the second type magnetic layer 13 is patterned in the form of circle by a photo-lithography for subsequent measurement of magnetic torque by a torque magnetometer. It was confirmed that a <100> direction is an axis of easy magnetization whilst a <110> direction vertical to the <100> direction is an axis of hard magnetization. It was also confirmed that a large iniaxial anisotropy of Ku $10^6$ erg/cm$^3$ per unit volume is provided to the (110) plane. If the magnetic field is applied in the <100> direction along the axis of easy magnetization, then a rectangular magnetic hysteresis loop with a large coercive force whilst if the magnetic field is applied in the <110> direction along the axis of hard magnetization, then the slender looped magnetic hysteresis with a small coercive force is obtained as illustrated in FIG. 4.

It is very important that each facet crystal grain is sharp-pointed or tapered, for example, by the sloped terraces bounded by the one-dimensional ridge as illustrated in FIG. 3, because the second type magnetic layer epitaxially grown on the facet surface of each of the facet crystal grains of the ferromagnetic layer performs as a single magnetic domain thereby resulting in an extremely large coercive force of the second type magnetic layer which has an extremely large force to pin magnetization of the second type magnetic layer. As a result, the second type magnetic layer has the pinned magnetization which is hard to rotate even under a large magnetic field externally applied. The facet crystal grain has a major axis in the <100> direction and a minor axis in the <110> direction. Each of the facet crystal grains in the ferromagnetic layer performs as a single magnetic domain. If the magnetic field is applied in the <100> direction along the axis of easy magnetization, then the coercive force Hc is given by Hc=2Ku/Ms where Ku is a unidirectional energy and Ms is a saturation magnetization. If the second type magnetic layer 3 is made of Fe, then Ku=the order of $10^6$ erg/cm$^3$ and Ms is the order of 1700 erg/cm$^3$, and then the coercive force He is the order of 1 kOe.

If the magnetic field is applied in the <100> direction along the axis of easy magnetization which is parallel to the ridge of the facet, then the magnetization and the magneto-resistance are measured and the measured values are obtained as illustrated in FIGS. 5 and 6. FIG. 5 is a diagram illustrative of a magnetization hysteresis loop to describe facet crystal grains. FIG. 6 is a diagram illustrative of a magnetoresistance hysteresis loop to describe facet crystal grains. In FIGS. 5 and 6, the directions of the magnetization are represented by arrow marks. If a sufficiently large magnetic field is applied in the positive direction, then the magnetization of the first and second type magnetic layers 15 and 13 is ordered (Point "A" in FIGS. 5 and 6). The magnetic domains are unlikely to move due to the facet crystal grains with the uniform orientation. In the magnetic rotation mode, the magnetization is varied. If the external magnetic field is applied in the direction along the easy axis of magnetization, then the magnetization loop showing a larger coercive force Hc1 is obtained. In the state where the magnetization of the first and second magnetic layers 15 and 13 are parallel to each other, the externally applied magnetic field is dropped. As the externally applied magnetic field approaches zero and corresponds to a coercive force Hc2 of the first type magnetic layer, then the magnetization of the first type magnetic layer is inverted (Point "B" in FIGS. 5 and 6). If 0>H>—Hc1 where H is the externally applied magnetic field, then the first and second type magnetic layers are anti-paralleled in magnetization. If the magnetic field externally applied is shifted to the negative direction, then the first and second type magnetic layers 15 and 13 are ferromagnetically ordered (Point "C" in FIGS. 5 and 6). If the magnetic field externally applied is then shifted into the positive direction and as the magnetic field approaches zero, then the magnetization is inverted (Point "D" in FIGS. 5 and 6). If 0<H<Hc1 where H is the externally applied magnetic field, then the first and second type magnetic layers 15 and 13 are anti-paralleled in magnetization. If the magnetic field externally applied is further increased in the positive direction, the first and second type magnetic layers 15 and 13 are ferromagnetically aligned in magnetization and the pint is returned to the initial point "A" in FIGS. 5 and 6. Therefore, the magnetization and magnetoresistance hysteresis loops are obtained as illustrated in FIGS. 5 and 6. If the first and second magnetic layers 15 and 13 are anti-paralleled in magnetization, the electrical resistance is high. If the first and second magnetic layers 15 and 13 are paralleled in magnetization, the electrical resistance is low. The magnetoresistance is varied as illustrated in FIG. 6. In the vicinity of zero magnetic field, a rapid change in magnetoresistance appears. The magnetoresistance is kept until near the coercive force of the second type magnetic layer 13 and then rapidly dropped to zero.

As described above, of the second type magnetic layer 13, the magnetization is pinned in the direction along the easy axis of magnetization whilst the first type magnetic layer 15 separated by the non-magnetic spacer layer 14 from the second type magnetic layer 13 shows no interaction with the second type magnetic layer 13. For this reason, the first type magnetic layer 15 allows the magnetization free to rotate in accordance with the externally applied magnetic field. The above stricture allows a spin valve operation of the magnetoresistance device. In order to cause the magnetization of the second type magnetic layer to rotate in the external magnetization direction, if, for example, the unidirectional anisotropy of the order of $10^6$ erg/cm$^3$ is provided to the second type magnetic layer, then a large magnetic field in the order of Hc1=1 kOe is required. The magnetization of the second type magnetic layer 13 is pinned by an apparently large exchange-coupling magnetic field, for which reason even if the above device is applied to a magnetic sensor such as magnetic head, then no rotation of magnetization of the second type magnetic layer 13 is caused and thereby a stable spin valve operation can be realized.

As a modification as illustrated in FIG. 8, it is possible to further provide a buffer layer 16 inserted between the second type magnetic layer and the substrate for relaxation of lattice miss-match between the substrate 11 and the second type magnetic layer 13. The buffer layer 16 may preferably comprise a body-centered crystal structure made of V, Cr, Zr, Nb, Mo, Hf, Ta, W, and alloys thereof.

The above spin valve magnetoresistive multi-layered structure may be formed by use of a molecular beam epitaxial system (ultra-high vacuum evaporation system). As a deposition source, an electron beam evaporation source is used. The system is provided with an electron gun and a fluorescent screen for reflection high-energy electron diffraction (RHEED) to evaluate the growing surface structure of the respective layers. The used epitaxial growth system is cable of making a vacuum of $1\times10^{-10}$ torr and the epitaxial growth is carried out in the order of $10^{-9}$ torr.

For various samples, the ferromagnetic layer 12 and the second type magnetic layers 13 are epitaxially grown under various conditions of substrate temperature and growth rate and various thicknesses thereof over various substrates 11. The second type magnetic layer has the body-centered crystal structure having facet crystal grains. Of each the facet crystal grain, the facet mean length "a" defined as the majority facet size in the direction along the ridge and the facet mean width "b" defined as the minority facet size in the direction vertical to the direction along the ridge are measured by an atomic force microscope (AFM). The results of measurements are represented as follows. Sample Nos. #22–24 have a buffer layer 16 inserted between the substrate 11 and the second type magnetic layer 13 for relaxation of lattice miss-match between the substrate 11 and the second type magnetic layer 13. The buffer layer 16 has a thickness of 13 nanometers and is made of Nb. The buffer layer 16 is grown under conditions of a substrate temperature of $T_B=900°$ C., and a growth rate of 0.4 nanometers/second. If the buffer layer 16 made of V, Cr, Zr, Nb, Mo, Hf, Ta, W, V—Cr alloy, Nb—Ta alloy, Mo—Zr alloy, or Hf—W alloy is used, then the results are almost the same as those of the sample No. #22–24.

Over the second type magnetic layer 13, at room temperature, a non-magnetic spacer layer 14 having a thickness of 3 nanometers is grown. Further, a first type magnetic layer 15 having a thickness of 5 nanometers is formed over the non-magnetic spacer layer 14. The grown layers are then patterned by photo-lithography for measurement of magnetoresistance by a direct current four-probe method under a magnetic field of until 1.5 kOe at room temperature. Measured is a magnetic field Hc1 at which the magnetization of the ferromagnetic layer of the body-centered crystal structure is inverted. Also measured is a magnetic field Hc2 at which the magnetization of the first type magnetic layer 15 is inverted. A magnetoresistance MR ratio is also measured.

Sample No. #13:

A Fe ferromagnetic layer 12 having a thickness of 50 nanometers is epitaxially grown on a ($11\bar{2}0$) plane of an Al$_2$O$_3$ substrate at a substrate temperature of 100° C. and a growth rate of 0.04 nanometers/second. The measured facet mean length is 80 nanometers and the measured facet mean width is 20 nanometers. A Ni magnetic layer 13 having a thickness of 5 nanometers is epitaxially formed on the ferromagnetic layer 12. A Cu non-magnetic spacer layer 14 having a thickness of 3 nanometers is grown at room temperature on the magnetic layer 13. A Fe magnetic layer 15 having a thickness of 5 nanometers is formed over the non-magnetic spacer layer 14. The grown layers are then patterned by photo-lithography for measurement of magnetoresistance by a direct current four-probe method under a magnetic field of until 1.5 kOe at room temperature. The measured magnetic field Hc1 is 800 Oe. The measured magnetic field Hc2 is 10 Oe. The measured magnetoresistance MR ratio is 6%.

Sample No. #14:

A Fe ferromagnetic layer 12 having a thickness of 50 nanometers is epitaxially grown on a ($11\bar{2}0$) plane of an Al$_2$O$_3$ substrate at a substrate temperature of −50° C. and a growth rate of 0.01 nanometers/second. The measured facet mean length is 30 nanometers and the measured facet mean width is 10 nanometers. A Fe$_{50}$Co$_{50}$ magnetic layer 13 having a thickness of 5 nanometers is epitaxially formed on the ferromagnetic layer 12. A Cu non-magnetic spacer layer 14 having a thickness of 3 nanometers is grown at room temperature on the magnetic layer 13. A Fe magnetic layer 15 having a thickness of 5 nanometers is formed over the non-magnetic spacer layer 14. The grown layers are then patterned by photolithography for measurement of magnetoresistance by a direct current four-probe method under a magnetic field of until 1.5 kOe at room temperature. The measured magnetic field Hc1 is 950 Oe. The measured magnetic field Hc2 is 20 Oe. The measured magnetoresistance MR ratio is 6%.

Sample No. #15:

A $Fe_{50}Co_{50}$ ferromagnetic layer 12 having a thickness of 30 nanometers is epitaxially grown on a $(11\bar{2}0)$ plane of an $Al_2O_3$ substrate at a substrate temperature of 30° C. and a growth rate of 0.02 nanometers/second. The measured facet mean length is 70 nanometers and the measured facet mean width is 15 nanometers. A Co magnetic layer 13 having a thickness of 5 nanometers is epitaxially formed on the ferromagnetic layer 12. An Ag non-magnetic spacer layer 14 having a thickness of 3 nanometers is grown at room temperature on the magnetic layer 13. A Ni magnetic layer 15 having a thickness of 5 nanometers is formed over the non-magnetic spacer layer 14. The grown layers are then patterned by photo-lithography for measurement of magnetoresistance by a direct current four-probe method under a magnetic field of until 1.5 kOe at room temperature. The measured magnetic field Hc1 is 850 Oe. The measured magnetic field Hc2 is 20 Oe. The measured magnetoresistance MR ratio is 8%.

Sample No. #16:

A $Fe_{95}Si_5$ ferromagnetic layer 12 having a thickness of 20 nanometers is epitaxially grown on a $(11\bar{2}0)$ plane of an $Al_2O_3$ substrate at a substrate temperature of 30° C. and a growth rate of 0.04 nanometers/second. The measured facet mean length is 60 nanometers and the measured facet mean width is 15 nanometers. A $Co_{80}Cr_{20}$ magnetic layer 13 having a thickness of 5 nanometers is epitaxially formed on the ferromagnetic layer 12. A Ti non-magnetic spacer layer 14 having a thickness of 3 nanometers is grown at room temperature on the magnetic layer 13. A $Ni_{81}Fe_{19}$ magnetic layer 15 having a thickness of 5 nanometers is formed over the non-magnetic spacer layer 14. The grown layers are then patterned by photo-lithography for measurement of magnetoresistance by a direct current four-probe method under a magnetic field of until 1.5 kOe at room temperature. The measured magnetic field Hc1 is 1000 Oe. The measured magnetic field Hc2 is 5 Oe. The measured magnetoresistance MR ratio is 7%.

Sample No. #17:

A $Fe_{90}V_{10}$ ferromagnetic layer 12 having a thickness of 25 nanometers is epitaxially grown on a $(11\bar{2}0)$ plane of an $Al_2O_3$ substrate at a substrate temperature of 30° C. and a growth rate of 0.02 nanometers/second. The measured facet mean length is 70 nanometers and the measured facet mean width is 20 nanometers. A Fe magnetic layer 13 having a thickness of 5 nanometers is epitaxially formed on the ferromagnetic layer 12. A Ru non-magnetic spacer layer 14 having a thickness of 3 nanometers is grown at room temperature on the magnetic layer 13. A $Ni_{66}Fe_{16}Co_{18}$ magnetic layer 15 having a thickness of 5 nanometers is formed over the non-magnetic spacer layer 14. The grown layers are then patterned by photo-lithography for measurement of magnetoresistance by a direct current four-probe method under a magnetic field of until 1.5 kOe at room temperature. The measured magnetic field Hc1 is 850 Oe. The measured magnetic field Hc2 is 4 Oe. The measured magnetoresistance MR ratio is 6%.

Sample No. #18:

A Fe ferromagnetic layer 12 having a thickness of 20 nanometers is epitaxially grown on a (110) plane of an MgO substrate at a substrate temperature of 50° C. and a growth rate of 0.1 nanometers/second. The measured facet mean length is 50 nanometers and the measured facet mean width is 10 nanometers. A $Co_{78}Cr_{19}Ta_3$ magnetic layer 13 having a thickness of 5 nanometers is epitaxially formed on the ferromagnetic layer 12. A Cu non-magnetic spacer layer 14 having a thickness of 3 nanometers is grown at room temperature on the magnetic layer 13. A $Fe_{85}Al_{5.4}Si_{9.6}$ magnetic layer 15 having a thickness of 5 nanometers is formed over the non-magnetic spacer layer 14. The grown layers are then patterned by photo-lithography for measurement of magnetoresistance by a direct current four-probe method under a magnetic field of until 1.5 kOe at room temperature. The measured magnetic field Hc1 is 980 Oe. The measured magnetic field Hc2 is 2 Oe. The measured magnetoresistance ratio is 5%.

Sample No. #19:

A $Fe_{50}Co_{50}$ ferromagnetic layer 12 having a thickness of 30 nanometers is epitaxially grown on a (110) plane of an MgO substrate at a substrate temperature of 100° C. and a growth rate of 0.1 nanometers/second. The measured facet mean length is 50 nanometers and the measured facet mean width is 10 nanometers. A $Co_{20}Pt_{80}$ magnetic layer 13 having a thickness of 5 nanometers is epitaxially formed on the ferromagnetic layer 12. A Cu non-magnetic spacer layer 14 having a thickness of 3 nanometers is grown at room temperature on the magnetic layer 13. An a-CoZr magnetic layer 15 having a thickness of 5 nanometers is formed over the non-magnetic spacer layer 14. The grown layers are then patterned by photo-lithography for measurement of magnetoresistance by a direct current four-probe method under a magnetic field of until 1.5 kOe at room temperature. The measured magnetic field Hc1 is 1050 Oe. The measured magnetic field Hc2 is 2 Oe. The measured magnetoresistance MR ratio is 4%.

Sample No. #20:

A Fe ferromagnetic layer 12 having a thickness of 25 nanometers is epitaxially grown on a $(11\bar{2}0)$ plane of an $SiO_2$ substrate at a substrate temperature of 30° C. and a growth rate of 0.1 nanometers/second. The measured facet mean length is 50 nanometers and the measured facet mean width is 10 nanometers. A $Sm_{95}Co_5$ magnetic layer 13 having a thickness of 5 nanometers is epitaxially formed on the ferromagnetic layer 12. A Cu non-magnetic spacer layer 14 having a thickness of 3 nanometers is grown at room temperature on the magnetic layer 13. A $Ni_{81}Fe_{19}$ magnetic layer 15 having a thickness of 5 nanometers is formed over the non-magnetic spacer layer 14. The grown layers are then patterned by photo-lithography for measurement of magnetoresistance by a direct current four-probe method under a magnetic field of until 1.5 kOe at room temperature. The measured magnetic field Hc1 is 1100 Oe. The measured magnetic field Hc2 is 3 Oe. The measured magnetoresistance MR ratio is 7%.

Sample No. #21:

A $Fe_{95}Si_5$ ferromagnetic layer 12 having a thickness of 25 nanometers is epitaxially grown on a $(11\bar{2}0)$ plane of an $SiO_2$ substrate at a substrate temperature of 30° C. and a growth rate of 0.05 nanometers/second. The measured facet mean length is 80 nanometers and the measured facet mean width is 20 nanometers. A $Fe_{50}V_{50}$ magnetic layer 13 having a thickness of 5 nanometers is epitaxially formed on the ferromagnetic layer 12. An Ag non-magnetic spacer layer 14 having a thickness of 3 nanometers is grown at room temperature on the magnetic layer 13. A $Ni_{24}Fe_{15}Co_{61}$ magnetic layer 15 having a thickness of 5 nanometers is formed over the non-magnetic spacer layer 14. The grown layers are then patterned by photo-lithography for measurement of magnetoresistance by a direct current four-probe method under a magnetic field of until 1.5 kOe at room temperature. The measured magnetic field Hc1 is 850 Oe. The measured magnetic field Hc2 is 2 Oe. The measured magnetoresistance MR ratio is 6%.

Sample No. #22:

A $Fe_{50}Co_{50}$ ferromagnetic layer 12 having a thickness of 30 nanometers is epitaxially grown on a $(11\overline{2}0)$ plane of an $Al_2O_3$ substrate at a substrate temperature of 30° C. and a growth rate of 0.05 nanometers/second. The measured facet mean length is 50 nanometers and the measured facet mean width is 10 nanometers. A $Co_{78}Co_{19}Ta_3$ magnetic layer 13 having a thickness of 5 nanometers is epitaxially formed on the ferromagnetic layer 12. A Cu non-magnetic spacer layer 14 having a thickness of 3 nanometers is grown at room temperature on the magnetic layer 13. A $Ni_{81}Fe_{19}$ magnetic layer 15 having a thickness of 5 nanometers is formed over the non-magnetic spacer layer 14. The grown layers are then patterned by photo-lithography for measurement of magnetoresistance by a direct current four-probe method under a magnetic field of until 1.5 kOe at room temperature. The measured magnetic field Hc1 is 900 Oe. The measured magnetic field Hc2 is 3 Oe. The measured magnetoresistance MR ratio is 4%.

Sample No. #23:

A $Fe_{50}Co_{50}$ magnetic layer 13 having a thickness of 25 nanometers is epitaxially grown on a (110) plane of an MgO substrate at a substrate temperature of 30° C. and a growth rate of 0.06 nanometers/second. The measured facet mean length is 40 nanometers and the measured facet mean width is 10 nanometers. A Ni magnetic layer 13 having a thickness of 5 nanometers is epitaxially formed on the ferromagnetic layer 12. A Cu non-magnetic spacer layer 14 having a thickness of 3 nanometers is grown at room temperature on the magnetic layer 13. A $Ni_{81}Fe_{19}$ magnetic layer 15 having a thickness of 5 nanometers is formed over the non-magnetic spacer layer 14. The grown layers are then patterned by photolithography for measurement of magnetoresistance by a direct current four-probe method under a magnetic field of until 1.5 kOe at room temperature. The measured magnetic field Hc1 is 750 Oe. The measured magnetic field Hc2 is 3 Oe. The measured magnetoresistance MR ratio is 3%.

Sample No. #24:

A $Fe_{50}Co_{50}$ ferromagnetic layer 12 having a thickness of 20 nanometers is epitaxially grown on a $(11\overline{2}0)$ plane of an $SiO_2$ substrate at a substrate temperature of 30° C. and a growth rate of 0.04 nanometers/second. The measured facet mean length is 40 nanometers and the measured facet mean width is 10 nanometers. A Co magnetic layer 13 having a thickness of 5 nanometers is epitaxially formed on the ferromagnetic layer 12. A Cu non-magnetic spacer layer 14 having a thickness of 3 nanometers is grown at room temperature on the magnetic layer 13. A $Ni_{81}Fe_{19}$ magnetic layer 15 having a thickness of 5 nanometers is formed over the non-magnetic spacer layer 14. The grown layers are then patterned by photo-lithography for measurement of magnetoresistance by a direct current four-probe method under a magnetic field of until 1.5 kOe at room temperature. The measured magnetic field Hc1 is 800 Oe. The measured magnetic field Hc2 is 3 Oe. The measured magnetoresistance MR ratio is 4%.

Comparative Sample No. #2:

A Fe ferromagnetic layer 12 free of facet crystal grain and having a thickness of 3 nanometers is epitaxially grown on a glass substrate. A Ni magnetic layer 13 having a thickness of 1.5 nanometers is epitaxially formed on the ferromagnetic layer 12. A Cu non-magnetic spacer layer 14 having a thickness of 2.5 nanometers is grown at room temperature on the magnetic layer 13. A $Ni_{81}Fe_{19}$ magnetic layer 15 having a thickness of 3 nanometers is formed over the non-magnetic spacer layer 14. The grown layers are then patterned by photo-lithography for measurement of magnetoresistance by a direct current four-probe method under a magnetic field of until 1.5 kOe at room temperature. The measured magnetic field Hc1 is 60 Oe. The measured magnetic field Hc2 is 5 Oe. The measured magnetoresistance MR ratio is 4%.

Third Embodiment

Figure 9:
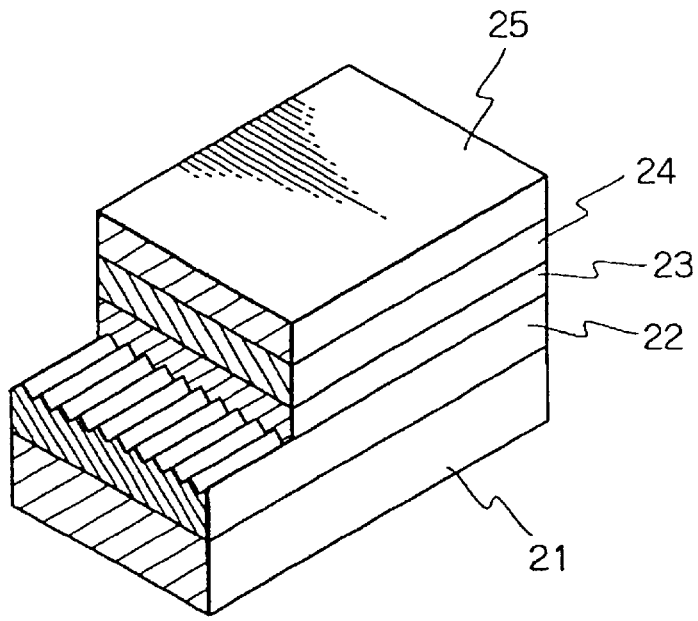
FIG. 9 is a perspective view illustrative of a spin valve magnetoresistive device formed on a substrate in a third embodiment according to the present invention.
Figure 10:
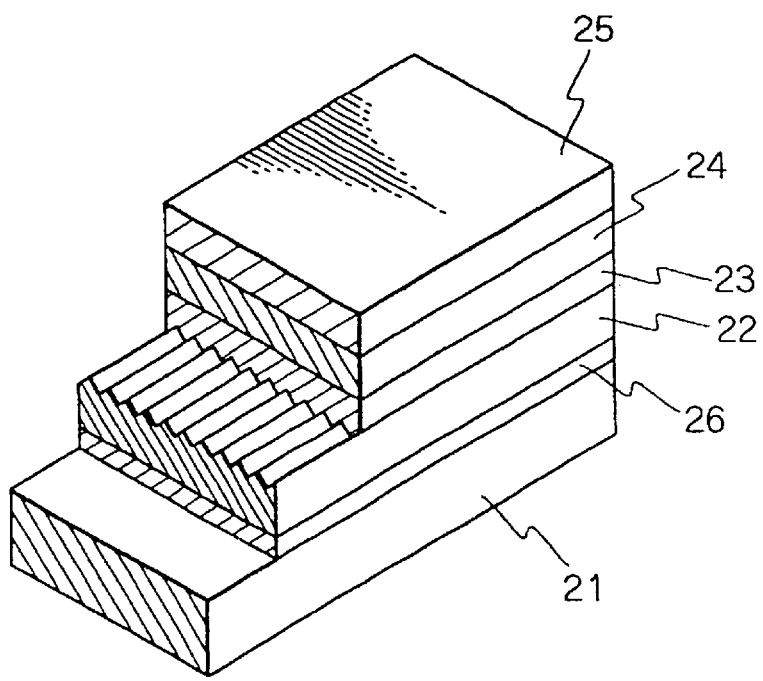
FIG. 10 is a perspective view illustrative of a spin valve magnetoresistive device formed on a buffer layer formed on a substrate in a modification to a third embodiment according to the present invention.

A third embodiment according to the present invention will be described as follows. FIG. 9 is a perspective view illustrative of a spin valve magnetoresistive device formed on a substrate in a third embodiment according to the present invention. FIG. 10 is a perspective view illustrative of a spin valve magnetoresistive device formed on a buffer layer formed on a substrate in a modification to a third embodiment according to the present invention.

As illustrated in FIG. 9, a spin valve magnetoresistive device is formed on a substrate 21. The substrate 21 may comprise a sapphire substrate with a $(11\overline{2}0)$ plane. Alternatively, the substrate 21 may also comprise a magnesium oxide substrate with a (110) plane. Further alternatively, the substrate 21 may also comprise a quartz substrate with a $(11\overline{2}0)$ plane. The spin valve magnetoresistive device has a multi-layered structure which comprises a first type magnetic layer 25 which magnetization is free to rotate in accordance with an external applied magnetic field, a non-magnetic spacer layer 24 extending on a bottom surface of the first type magnetic film 25, a second type magnetic layer 23 extending on a bottom surface of the non-magnetic spacer layer 24 so that the first type magnetic layer 25 is separated by the non-magnetic spacer layer 24 from the second type magnetic layer 23, and a non-magnetic layer 22 extending on a bottom surface of the second type magnetic layer 23. The non-magnetic layer 22 extends on a top surface of the substrate 21. The second type magnetic layer 23 epitaxially grown on a facet surface of the non-magnetic layer 22 also has a facet single crystal grain structure with a uniform crystal orientation whilst the first type magnetic layer is free of any facet single crystal grain structure with a uniform crystal orientation. Each crystal grain of the facet single crystal grain structure in the second type magnetic layer 23 has a facet surface interfaced with the non-magnetic layer 22. The non-magnetic layer 22 may be made of V, Cr, Nb, Mo, Hf, Ta, W, or alloys thereof and has a body-centered cubic lattice structure epitaxially grown in a [110] direction so that each crystal grain of the facet single crystal grain structure has a facet surface which comprises a pair of sloped terraces bounded by a ridge which is parallel to a <001> direction in a (110) plane and the crystal grains of the facet single crystal grain structure are periodically aligned in a <110> direction in the (110) plane. The second type magnetic layer 23 may, for example, be made of Fe, Fe—Co alloy, Fe-based alloys in the form of a body-centered cubic lattice structure. Alternatively, the second type magnetic layer 23 may, for example, be made of Ni, Ni—Fe based alloy in the form of face-centered cubic lattice structure or Co, Co—Cr—Ta alloy, Co—Pt alloy in the form of hexagonal lattice structure or rare earth metal/cobalt-based intermetallic compounds. The non-magnetic spacer layer 24 may be made of Cu, Au, Ag in the form of cubit system lattice structure or Ti, Ru in the form of hexagonal system lattice structure. The first type magnetic layer 25 has no facet crystal grains but has a uniform crystal orientation. The non-magnetic spacer layer 24 has a thickness in the range of 2–6 nanometers to prevent appearance of exchange-coupling between the first and second type magnetic layers 25 and 23. The first type magnetic layer 25 may comprise Fe, Co, Ni, Ni—Fe, Ni—Fe—Co, Fe—Al—Si, or Co-based amorphous alloy soft magnetic layers. There is no particular limitation to the thickness of the first and second type magnetic layers 25 and 23. Notwithstanding, it might be preferable that the thickness of each the first and second type magnetic layers 25 and 23 is in the range of 0.4 nanometers to 30 nanometers in consideration with the facts that it is difficult to obtain a uniform thickness of less than 0.4 nanometers and a larger thickness exceeding 30 nanometers is not necessary.

The facet single crystal grain structure with a uniform crystal orientation means a single crystal structure being epitaxially grown in a uniform direction and having a facet surface comprising a plurality of pairs of sloped terraces bounded by a ridge in the form of undulations. Each facet crystal grain has a pair of sloped terraces bounded by a ridge in the form of an undulation. FIG. 3 is a perspective view illustrative of a facet single crystal grain structure appearing on a surface of a body-centered cubic crystal structure epitaxially grown in a [110] direction. If the facet crystal grains having a facet surface with undulations are formed in the initial stage for epitaxial growth, then the undulations of the facet surface of the facet crystal grains becomes large thereby forming a plurality of roofs each of which comprises a pair of sloped terraces bounded by a ridge as well illustrated in FIG. 3. Each facet crystal grain has a roof comprising a pair of sloped terraces bounded by a ridge. Since the facet crystal grains are epitaxially grown, the ridges bounding the paired sloped terraces are uniformly directed or ordered in parallel to a crystal orientation. The second type magnetic layer 23 comprises a ferromagnetic metal or a ferromagnetic metal alloy having a body-centered cubic lattice structure epitaxially grown in a [110] direction so that each crystal grain of the facet single crystal grain structure has a facet surface which comprises a pair of sloped terraces bounded by a ridge which is parallel to a <001> direction in a (110) plane and the crystal grains of the facet single crystal grain structure are periodically aligned in a <110> direction in the (110) plane. The size of each of the facet crystal grains is defined by both a longitudinal length "a" in a direction along the ridge bounding the paired sloped terraces in the form of the single roof and a transverse length "b" in a vertical direction to the ridge. The uniformity both in the crystal orientation or the direction of the ridges and in the sizes of the facet crystal grains results in substantially and periodically uniform undulations comprising the plural roofs, each of which comprises a pair of the sloped terraces bounded by the ridge. The longitudinal and transverse lengths "a" and "b" of each the facet crystal grains are varied depending upon epitaxial growth conditions such as a growth temperature and a growth rate and thickness of the layer, but may be considered to be almost uniform in the average. Only the second type magnetic layer 23 is patterned in the form of circle by a photolithography for subsequent measurement of magnetic torque by a torque magnetometer. It was confirmed that a <100> direction is an easy axis of magnetization whilst a <110> direction vertical to the <100> direction is a hard axis of magnetization. It was also confirmed that a large uniaxial anisotropy of Ku $10^6$ erg/cm$^3$ per unit volume is provided to the (110) plane. If the magnetic field is applied in the <100> direction along the axis easy of magnetization, then a rectangular magnetic hysteresis loop with a large coercive force whilst if the magnetic field is applied in the <110> direction along the hard axis of magnetization, then the slender looped magnetic hysteresis with a small coercive force is obtained as illustrated in FIG. 4.

It is very important that each facet crystal grain is sharp-pointed or tapered, for example, by the sloped terraces bounded by the one-dimensional ridge as illustrated in FIG. 3, because the second type magnetic layer epitaxially grown on the facet surface of each of the facet crystal grains of the non-magnetic layer performs as a single magnetic domain thereby resulting in an extremely large coercive force of the second type magnetic layer which has an extremely large force to pin magnetization of the second type magnetic layer. As a result, the second type magnetic layer has the pinned magnetization which is hard to rotate even under a large magnetic field externally applied. The facet crystal grain has a major axis in the <100> direction and a minor axis in the <110> direction. Each of the facet crystal grains in the ferromagnetic layer performs as a single magnetic domain. If the magnetic field is applied in the <100> direction along the axis of easy magnetization, then the coercive force Hc is given by Hc=2Ku/Ms where Ku is a unidirectional energy and Ms is a saturation magnetization. If the second type magnetic layer 3 is made of Fe, then Ku=the order of $10^6$ erg/cm$^3$ and Ms is the order of 1700 erg/cm$^3$, and then the coercive force Hc is the order of 1 kOe.

If the magnetic field is applied in the <100> direction along the axis of easy magnetization which is parallel to the ridge of the facet, then the magnetization and the magnetoresistance are measured and the measured values are obtained as illustrated in FIGS. 5 and 6. FIG. 5 is a diagram illustrative of a magnetization hysteresis loop to describe facet crystal grains. FIG. 6 is a diagram illustrative of a magnetoresistance hysteresis loop to describe facet crystal grains. In FIGS. 5 and 6, the directions of the magnetization are represented by arrow marks. If a sufficiently large magnetic field is applied in the positive direction, then the magnetization of the first and second type magnetic layers 25 and 23 is ordered (Point "A" in FIGS. 5 and 6). The magnetic domains are unlikely to move due to the facet crystal grains with the uniform orientation. In the magnetic rotation mode, the magnetization is varied. If the external magnetic field is applied in the direction along the easy axis of magnetization, then the magnetization loop showing a larger coercive force Hc1 is obtained. In the state where the magnetization of the first and second magnetic layers 25 and 23 are parallel to each other, the externally applied magnetic field is dropped. As the externally applied magnetic field approaches zero and corresponds to a coercive force Hc2 of the first type magnetic layer, then the magnetization of the first type magnetic layer is inverted (Point "B" in FIGS. 5 and 6). If 0>H>—Hc1 where H is the externally applied magnetic field, then the first and second type magnetic layers are anti-paralleled in magnetization. If the magnetic field externally applied is shifted to the negative direction, then the first and second type magnetic layers 25 and 23 are ferromagnetically ordered (Point "C" in FIGS. 5 and 6). If the magnetic field externally applied is then shifted into the positive direction and as the magnetic field approaches zero, then the magnetization is inverted (Point "D" in FIGS. 5 and 6). If 0<H<Hc1 where H is the externally applied magnetic field, then the first and second type magnetic layers 25 and 23 are anti-paralleled in magnetization. If the magnetic field externally applied is further increased in the positive direction, the first and second type magnetic layers 25 and 23 are ferromagnetically aligned in magnetization and the pint is returned to the initial point "A" in FIGS. 5 and 6. Therefore, the magnetization and magnetoresistance hysteresis loops are obtained as illustrated in FIGS. 5 and 6. If the first and second magnetic layers 25 and 23 are anti-paralleled in magnetization, the electrical resistance is high. If the first and second magnetic layers 25 and 23 are paralleled in magnetization, the electrical resistance is low.

The magnetoresistance is varied as illustrated in FIG. 6. In the vicinity of zero magnetic field, a rapid change in magnetoresistance appears. The magnetoresistance is kept until near the coercive force of the second type magnetic layer 23 and then rapidly dropped to zero, As described above, of the second type magnetic layer 23, the magnetization is pinned in the direction along the axis of the easy magnetization whilst the first type magnetic layer 25 separated by the non-magnetic spacer layer 24 from the second type magnetic layer 23 shows no interaction with the second type magnetic layer 23. For this reason, the first type magnetic layer 25 allows the magnetization free to rotate in accordance with the externally applied magnetic field. The above structure allows a spin valve operation of the magnetoresistance device. In order to cause the magnetization of the second type magnetic layer to rotate in the external magnetization direction, if, for example, the unidirectional anisotropy of the order of $10^6$ erg/cm$^3$ is provided to the second type magnetic layer, then a large magnetic field in the order of Hc1=1 kOe is required. The magnetization of the second type magnetic layer 23 is pinned by an apparently large exchange-coupling magnetic field, for which reason even if the above device is applied to a magnetic sensor such as magnetic head, then no rotation of magnetization of the second type magnetic layer 23 is caused and thereby a stable spin valve operation can be realized.

As a modification as illustrated in FIG. 8, it is possible to further provide a buffer layer 26 inserted between the second type magnetic layer and the substrate for relaxation of lattice miss-match between the substrate 21 and the second type magnetic layer 23. The buffer layer 26 may preferably comprise a body-centered cubic crystal structure made of V, Cr, Zr, Nb, Mo, Hf, Ta, W, and alloys thereof.

The above spin valve magnetoresistive multi-layered structure may be formed by use of a molecular beam epitaxial system (ultra-high vacuum evaporation system). As a deposition source, an electron beam evaporation source is used. The system is provided with an electron gun and a fluorescent screen for reflection high-energy electron diffraction (RHEED) to evaluate the growing surface structure of the respective layers. The used epitaxial growth system is cable of making a vacuum of $1 \times 10^{-10}$ torr and the epitaxial growth is carried out in the order of $10^{-9}$ torr.

For various samples, the non-magnetic layer 22 and the second type magnetic layers 23 are epitaxially grown under various conditions of substrate temperature and growth rate and various thicknesses thereof over various substrates 21. The second type magnetic layer has the body-centered crystal structure having facet crystal grains. Of each the facet crystal grain, the facet mean length "a" defined as the majority facet size in the direction along the ridge and the facet mean width "b" defined as the minority facet size in the direction vertical to the direction along the ridge are measured by an atomic force microscope (AFM). The results of measurements are represented as follows. Sample Nos. #34–36 have a buffer layer 26 inserted between the substrate 21 and the second type magnetic layer 23 for relaxation of lattice miss-match between the substrate 21 and the second type magnetic layer 23. The buffer layer 26 has a thickness of 13 nanometers and is made of Nb. The buffer layer 26 is grown under conditions of a substrate temperature of $T_B$=900° C., and a growth rate of 0.4 nanometers/second. If the buffer layer 26 made of V, Cr, Zr, Nb, Mo, Hf, Ta, W, V—Cr alloy, Nb—Ta alloy, Mo—Zr alloy, or Hf—W alloy is used, then the results are almost the same as those of the sample No. #34–36.

Over the second type magnetic layer 23, at room temperature, a non-magnetic spacer layer 24 having a thickness of 3 nanometers is grown. Further, a first type magnetic layer 25 having a thickness of 5 nanometers is formed over the non-magnetic spacer layer 24. The grown layers are then patterned by photo-lithography for measurement of magnetoresistance by a direct current four-probe method under a magnetic field of until 1.5 kOe at room temperature. Measured is a magnetic field Hc1 at which the magnetization of the ferromagnetic layer of the body-centered crystal structure is inverted. Also measured is a magnetic field Hc2 at which the magnetization of the first type magnetic layer 25 is inverted. A magnetoresistance MR ratio is also measured.

Sample No. #25:

A Ta non-magnetic layer 22 having a thickness of 20 nanometers is epitaxially grown on a (11$\bar{2}$0) plane of an Al$_2$O$_3$ substrate at a substrate temperature of 200° C. and a growth rate of 0.1 nanometers/second. The measured facet mean length is 70 nanometers and the measured facet mean width is 15 nanometers. A Ni$_{81}$Fe$_{19}$ magnetic layer 23 having a thickness of 5 nanometers is epitaxially formed on the non-magnetic layer 22. A Cu non-magnetic spacer layer 24 having a thickness of 3 nanometers is grown at room temperature on the magnetic layer 23. A Fe magnetic layer 25 having a thickness of 5 nanometers is formed over the non-magnetic spacer layer 24. The grown layers are then patterned by photo-lithography for measurement of magnetoresistance by a direct current four-probe method under a magnetic field of until 1.5 kOe at room temperature. The measured magnetic field Hc1 is 800 Oe. The measured magnetic field Hc2 is 10 Oe. The measured magnetoresistance MR ratio is 6%.

Sample No. #26:

A Cr non-magnetic layer 22 having a thickness of 20 nanometers is epitaxially grown on a (11$\bar{2}$0) plane of an Al$_2$O$_3$ substrate at a substrate temperature of –50° C. and a growth rate of 0.1 nanometers/second. The measured facet mean length is 30 nanometers and the measured facet mean width is 10 nanometers. A Fe$_{50}$V$_{50}$ magnetic layer 23 having a thickness of 5 nanometers is epitaxially formed on the non-magnetic layer 22. A Cu non-magnetic spacer layer 24 having a thickness of 3 nanometers is grown at room temperature on the magnetic layer 23. A Fe magnetic layer 25 having a thickness of 5 nanometers is formed over the non-magnetic spacer layer 24. The grown layers are then patterned by photo-lithography for measurement of magnetoresistance by a direct current four-probe method under a magnetic field of until 1.5 kOe at room temperature. The measured magnetic field Hc1 is 950 Oe. The measured magnetic field Hc2 is 20 Oe. The measured magnetoresistance MR ratio is 6%

Sample No. #27:

A Mo non-magnetic layer 22 having a thickness of 15 nanometers is epitaxially grown on a (11$\bar{2}$0) plane of an Al$_2$O$_3$ substrate at a substrate temperature of 200° C. and a growth rate of 0.05 nanometers/second. The measured facet mean length is 80 nanometers and the measured facet mean width is 15 nanometers. A Co magnetic layer 23 having a thickness of 5 nanometers is epitaxially formed on the non-magnetic layer 22. An Ag non-magnetic spacer layer 24 having a thickness of 3 nanometers is grown at room temperature on the magnetic layer 23. A Ni magnetic layer 25 having a thickness of 5 nanometers is formed over the non-magnetic spacer layer 24. The grown layers are then patterned by photo-lithography for measurement of magnetoresistance by a direct current four-probe method under a magnetic field of until 1.5 kOe at room temperature. The measured magnetic field Hc1 is 850 Oe. The measured magnetic field Hc2 is 20 Oe. The measured magnetoresistance MR ratio is 8%.

Sample No. #28:

A Nb non-magnetic layer 22 having a thickness of 20 nanometers is epitaxially grown on a (11$\bar{2}$0) plane of an Al$_2$O$_3$ substrate at a substrate temperature of 100° C. and a growth rate of 0.5 nanometers/second. The measured facet mean length is 60 nanometers and the measured facet mean width is 15 nanometers. A Co$_{80}$Cr$_{20}$ magnetic layer 23 having a thickness of 5 nanometers is epitaxially formed on the non-magnetic layer 22. A Ti non-magnetic spacer layer 24 having a thickness of 3 nanometers is grown at room temperature on the magnetic layer 23. A Ni$_{81}$Fe$_{19}$ magnetic layer 25 having a thickness of 5 nanometers is formed over the non-magnetic spacer layer 24. The grown layers are then patterned by photo-lithography for measurement of magnetoresistance by a direct current four-probe method under a magnetic field of until 1.5 kOe at room temperature. The measured magnetic field Hc1 is 1000 Oe. The measured magnetic field Hc2 is 5 Oe. The measured magnetoresistance MR ratio is 7%.

Sample No. #29:

A W non-magnetic layer 22 having a thickness of 25 nanometers is epitaxially grown on a (11$\bar{2}$0) plane of an Al$_2$O$_3$ substrate at a substrate temperature of 200° C. and a growth rate of 0.2 nanometers/second. The measured facet mean length is 70 nanometers and the measured facet mean width is 20 nanometers. A Ni magnetic layer 23 having a thickness of 5 nanometers is epitaxially formed on the non-magnetic layer 22. A Ru non-magnetic spacer layer 24 having a thickness of 3 nanometers is grown at room temperature on the magnetic layer 23. A Ni$_{66}$Fe$_{16}$Co$_{18}$ magnetic layer 25 having a thickness of 5 nanometers is formed over the non-magnetic spacer layer 24. The grown layers are then patterned by photo-lithography for measurement of magnetoresistance by a direct current four-probe method under a magnetic field of until 1.5 kOe at room temperature. The measured magnetic field Hc1 is 850 Oe. The measured magnetic field Hc2 is 4 Oe. The measured magnetoresistance MR ratio is 6%.

Sample No. #30:

A Hf$_{10}$Ta$_{90}$ non-magnetic layer 22 having a thickness of 15 nanometers is epitaxially grown on a (110) plane of an MgO substrate at a substrate temperature of 50° C. and a growth rate of 0.3 nanometers/second. The measured facet mean length is 50 nanometers and the measured facet mean width is 10 nanometers. A Co$_{78}$Cr$_{19}$Ta$_3$ magnetic layer 23 having a thickness of 5 nanometers is epitaxially formed on the non-magnetic layer 22. A Cu non-magnetic spacer layer 24 having a thickness of 3 nanometers is grown at room temperature on the magnetic layer 23. A Fe$_{85}$Al$_{5.4}$Si$_{9.6}$ magnetic layer 25 having a thickness of 5 nanometers is formed over the non-magnetic spacer layer 24. The grown layers are then patterned by photo-lithography for measurement of magnetoresistance by a direct current four-probe method under a magnetic field of until 1.5 kOe at room temperature. The measured magnetic field Hc1 is 980 Oe. The measured magnetic field Hc2 is 2 Oe. The measured magnetoresistance MR ratio is 5%.

Sample No. #31:

A Nb$_{50}$Ta$_{50}$ non-magnetic layer 22 having a thickness of 20 nanometers is epitaxially grown on a (110) plane of an MgO substrate at a substrate temperature of 100° C. and a growth rate of 0.5 nanometers/second. The measured facet mean length is 40 nanometers and the measured facet mean width is 10 nanometers. A Sm$_{95}$Co$_5$ magnetic layer 23 having a thickness of 5 nanometers is epitaxially formed on the non-magnetic layer 22. A Cu non-magnetic spacer layer 24 having a thickness of 3 nanometers is grown at room temperature on the magnetic layer 23. An a-CoZr magnetic layer 25 having a thickness of 5 nanometers is formed over the non-magnetic spacer layer 24. The grown layers are then patterned by photo-lithography for measurement of magnetoresistance by a direct current four-probe method under a magnetic field of until 1.5 kOe at room temperature. The measured magnetic field Hc1 is 1050 Oe. The measured magnetic field Hc2 is 2 Oe. The measured magnetoresistance MR ratio is 4%.

Sample No. #32:

A Zr non-magnetic layer 22 having a thickness of 20 nanometers is epitaxially grown on a (11$\bar{2}$0) plane of an SiO$_2$ substrate at a substrate temperature of 150° C. and a growth rate of 0.5 nanometers/second. The measured facet mean length is 70 nanometers and the measured facet mean width is 10 nanometers. A Fe$_{80}$Si$_{20}$ magnetic layer 23 having a thickness of 5 nanometers is epitaxially formed on the non-magnetic layer 22. A Cu non-magnetic spacer layer 24 having a thickness of 3 nanometers is grown at room temperature on the magnetic layer 23. A Ni$_{81}$Fe$_{19}$ magnetic layer 25 having a thickness of 5 nanometers is formed over the non-magnetic spacer layer 24. The grown layers are then patterned by photo-lithography for measurement of magnetoresistance by a direct current four-probe method under a magnetic field of until 1.5 kOe at room temperature. The measured magnetic field Hc1 is 1100 Oe. The measured magnetic field Hc2 is 3 Oe. The measured magnetoresistance MR ratio is 7%.

Sample No. #33:

A V$_{95}$Cr$_5$ non-magnetic layer 22 having a thickness of 20 nanometers is epitaxially grown on a (11$\bar{2}$0) plane of an SiO$_2$ substrate at a substrate temperature of 200° C. and a growth rate of 0.5 nanometers/second. The measured facet mean length is 70 nanometers and the measured facet mean width is 20 nanometers. A Fe$_{50}$Co$_{50}$ magnetic layer 23 having a thickness of 5 nanometers is epitaxially formed on the non-magnetic layer 22. An Ag non-magnetic spacer layer 24 having a thickness of 3 nanometers is grown at room temperature on the magnetic layer 23. A Ni$_{24}$Fe$_{15}$Co$_{61}$ magnetic layer 25 having a thickness of 5 nanometers is formed over the non-magnetic spacer layer 24. The grown layers are then patterned by photo-lithography for measurement of magnetoresistance by a direct current four-probe method under a magnetic field of until 1.5 kOe at room temperature. The measured magnetic field Hc1 is 850 Oe. The measured magnetic field Hc2 is 2 Oe. The measured magnetoresistance MR ratio is 6%.

Sample No. #34:

A Cr non-magnetic layer 22 having a thickness of 15 nanometers is epitaxially grown on a (11$\bar{2}$0) plane of an Al$_2$O$_3$ substrate at a substrate temperature of 50° C. and a growth rate of 1.0 nanometers/second. The measured facet mean length is 30 nanometers and the measured facet mean width is 10 nanometers. A Co$_{20}$Pt$_{80}$ magnetic layer 23 having a thickness of 5 nanometers is epitaxially formed on the non-magnetic layer 22. A Cu non-magnetic spacer layer 24 having a thickness of 3 nanometers is grown at room temperature on the magnetic layer 23. A Ni$_{81}$Fe$_{19}$ magnetic layer 25 having a thickness of 5 nanometers is formed over the non-magnetic spacer layer 24. The grown layers are then patterned by photo-lithography for measurement of magnetoresistance by a direct current four-probe method under a magnetic field of until 1.5 kOe at room temperature. The measured magnetic field Hc1 is 900 Oe. The measured magnetic field Hc2 is 3 Oe. The measured magnetoresistance MR ratio is 4%.

Sample No. #35:

A V non-magnetic layer 22 having a thickness of 15 nanometers is epitaxially grown on a (110) plane of an MgO substrate at a substrate temperature of 100° C. and a growth rate of 2.0 nanometers/second. The measured facet mean length is 50 nanometers and the measured facet mean width is 15 nanometers. A Fe magnetic layer 23 having a thickness of 5 nanometers is epitaxially formed on the non-magnetic layer 22. A Cu non-magnetic spacer layer 24 having a thickness of 3 nanometers is grown at room temperature on the magnetic layer 23. A $Ni_{81}Fe_{19}$ magnetic layer 25 having a thickness of 5 nanometers is formed over the non-magnetic spacer layer 24. The grown layers are then patterned by photolithography for measurement of magnetoresistance by a direct current four-probe method under a magnetic field of until 1.5 kOe at room temperature. The measured magnetic field Hc1 is 900 Oe. The measured magnetic field Hc2 is 3 Oe. The measured magnetoresistance MR ratio is 3%.

Sample No. #36:

A Zr non-magnetic layer 22 having a thickness of 20 nanometers is epitaxially grown on a (11$\bar{2}$0) plane of an $SiO_2$ substrate at a substrate temperature of 30° C. and a growth rate of 3.0 nanometers/second. The measured facet mean length is 40 nanometers and the measured facet mean width is 20 nanometers. A Co magnetic layer 23 having a thickness of 5 nanometers is epitaxially formed on the non-magnetic layer 22. A Cu non-magnetic spacer layer 24 having a thickness of 3 nanometers is grown at room temperature on the magnetic layer 23. A $Ni_{81}Fe_{19}$ magnetic layer 25 having a thickness of 5 nanometers is formed over the non-magnetic spacer layer 24. The grown layers are then patterned by photo-lithography for measurement of magnetoresistance by a direct current four-probe method under a magnetic field of until 1.5 kOe at room temperature. The measured magnetic field Hc1 is 800 Oe. The measured magnetic field Hc2 is 3 Oe. The measured magnetoresistance MR ratio is 4%.

Comparative Sample No. 3:

A Cr non-magnetic layer 22 free of facet crystal grain and having a thickness of 3 nanometers is epitaxially grown on a glass substrate. A Co magnetic layer 23 having a thickness of 1.5 nanometers is epitaxially formed on the non-magnetic layer 22. A Cu non-magnetic spacer layer 24 having a thickness of 2.5 nanometers is grown at room temperature on the magnetic layer 23. A $Ni_{81}Fe_{19}$ magnetic layer 25 having a thickness of 3 nanometers is formed over the non-magnetic spacer layer 24. The grown layers are then patterned by photo-lithography for measurement of magnetoresistance by a direct current four-probe method under a magnetic field of until 1.5 kOe at room temperature. The measured magnetic field Hc1 is 40 Oe. The measured magnetic field Hc2 is 5 Oe. The measured magnetoresistance MR ratio is 3%.

Fourth Embodiment

Figure 11:
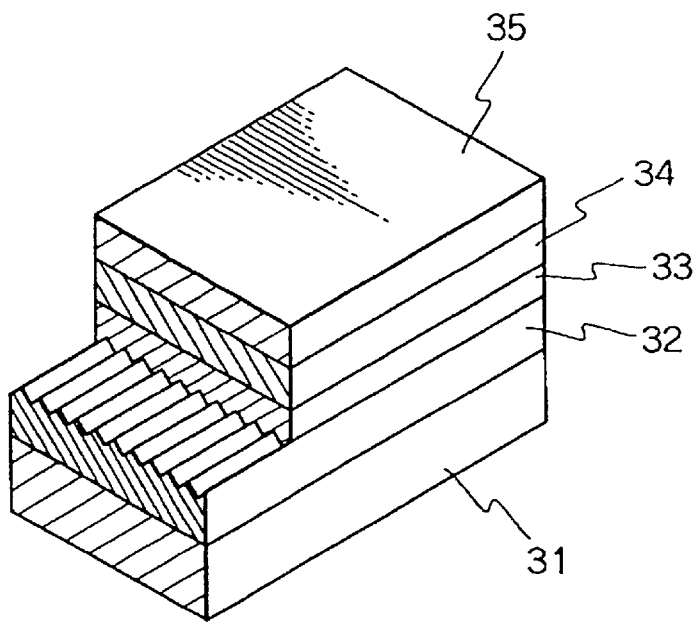
FIG. 11 is a perspective view illustrative of a spin valve magnetoresistive device formed on a substrate in a fourth embodiment according to the present invention.
Figure 12:
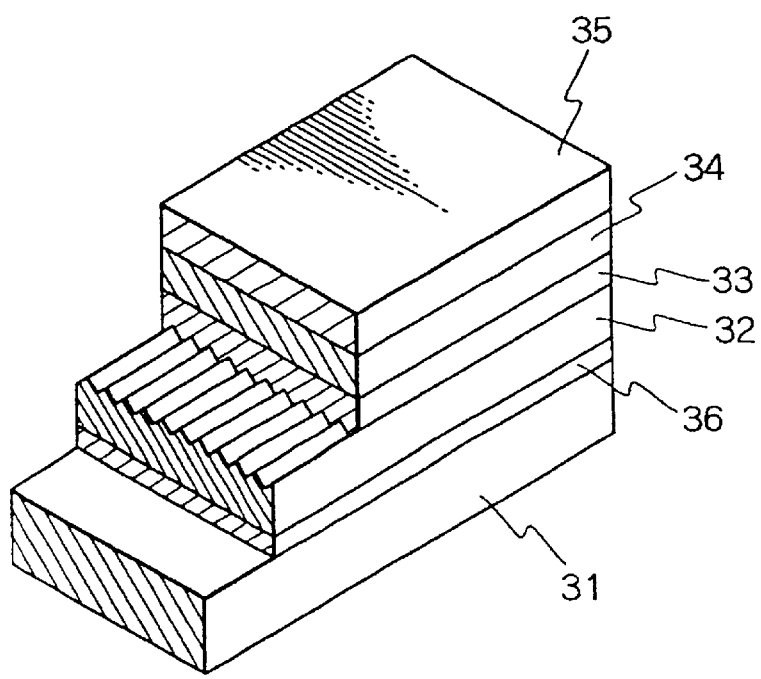
FIG. 12 is a perspective view illustrative of a spin valve magnetoresistive device formed on a buffer layer formed on a substrate in a modification to a fourth embodiment according to the present invention.

A fourth embodiment according to the present invention will be described as follows. FIG. 11 is a perspective view illustrative of a spin valve magnetoresistive device formed on a substrate in a fourth embodiment according to the present invention. FIG. 12 is a perspective view illustrative of a spin valve magnetoresistive device formed on a buffer layer formed on a substrate in a modification to a fourth embodiment according to the present invention.

As illustrated in FIG. 11, a spin valve magnetoresistive device is formed on a substrate 31. The substrate 31 may comprise a sapphire substrate with a (11$\bar{2}$0) plane. Alternatively, the substrate 31 may also comprise a magnesium oxide substrate with a (110) plane. Further alternatively, the substrate 31 may also comprise a quartz substrate with a (11$\bar{2}$0) plane. The spin valve magnetoresistive device has a multi-layered structure which comprises a first type magnetic layer 35 which magnetization is free to rotate in accordance with an external applied magnetic field, a non-magnetic spacer layer 34 extending on a bottom surface of the first type magnetic film 35, a second type magnetic layer 33 extending on a bottom surface of the non-magnetic spacer layer 34 so that the first type magnetic layer 35 is separated by the non-magnetic spacer layer 34 from the second type magnetic layer 33, and a intermetallic compound layer 32 extending on a bottom surface of the second type magnetic layer 33. The intermetallic compound layer 32 extends on a top surface of the substrate 31. The second type magnetic layer 33 epitaxially grown on a facet surface of the intermetallic compound layer 32 also has a facet single crystal grain structure with a uniform crystal orientation whilst the first type magnetic layer is free of any facet single crystal grain structure with a uniform crystal orientation. Each crystal grain of the facet single crystal grain structure in the second type magnetic layer 33 has a facet surface interfaced with the intermetallic compound layer 32. The intermetallic compound layer 32 may be made of preferably NiAl, CuZn, CuPd and has a body-centered lattice structure epitaxially grown in a [110] direction so that each crystal grain of the facet single crystal grain structure has a facet surface which comprises a pair of sloped terraces bounded by a ridge which is parallel to a <001> direction in a (110) plane and the crystal grains of the facet single crystal grain structure are periodically aligned in a <110> direction in the (110) plane. The second type magnetic layer 33 may, for example, be made of Fe, Fe—Co alloy, Fe-based alloys in the form of a body-centered lattice structure. Alternatively, the second type magnetic layer 33 may, for example, be made of Ni, Ni—Fe based alloy in the form of face-centered lattice structure or Co, Co—Cr—Ta alloy, Co—Pt alloy in the form of hexagonal lattice structure or rare earth metalcobalt-based intermetallic compounds. The non-magnetic spacer layer 34 may be made of Cu, Au, Ag in the form of cubic system lattice structure or Ti, Ru in the form of hexagonal system lattice structure. The first type magnetic layer 35 has no facet crystal grains but has a uniform crystal orientation. The non-magnetic spacer layer 34 has a thickness in the range of 2–6 nanometers to prevent appearance of exchange-coupling between the first and second type magnetic layers 35 and 33. The first type magnetic layer 35 may comprise Fe, Co, Ni, Ni—Fe, Ni—Fe—Co, Fe—Al—Si, or Co-based amorphous alloy soft magnetic layers. There is no particular limitation to the thickness of the first and second type magnetic layers 35 and 33. Notwithstanding, it might be preferable that the thickness of each the first and second type magnetic layers 35 and 33 is in the range of 0.4 nanometers to 30 nanometers in consideration with the facts that it is difficult to obtain a uniform thickness of less than 0.4 nanometers and a larger thickness exceeding 30 nanometers is not necessary The facet single crystal grain structure with a uniform crystal orientation means a single crystal structure being epitaxially grown in a uniform direction and having a facet surface comprising a plurality of pairs of sloped terraces bounded by a ridge in the form of undulations. Each facet crystal grain has a pair of sloped terraces bounded by a ridge in the form of an undulation. FIG. 3 is a perspective view illustrative of a facet single crystal grain stricture appearing on a surface of a body-centered cubic crystal structure epitaxially grown in a [110] direction. If the facet crystal grains having a facet surface with undulations are formed in the initial stage for epitaxial growth, then the undulations of the facet space of the facet crystal grains becomes large thereby forming a plurality of roofs each of which comprises a pair of sloped terraces bounded by a ridge as well illustrated in FIG. 3. Each facet crystal grain has a roof comprising a pair of sloped terraces bounded by a ridge. Since the facet crystal grains are epitaxially grown, the ridges bounding the paired sloped terraces are uniformly directed or ordered in parallel to a crystal orientation. The second type magnetic layer 33 comprises a ferromagnetic metal or a ferromagnetic metal alloy having a body-centered cubic lattice structure epitaxially grown in a [110] direction so that each crystal grain of the facet single crystal grain structure has a facet surface which comprises a pair of sloped terraces bounded by a ridge which is parallel to a <001> direction in a (110) plane and the crystal grains of the facet single crystal grain structure are periodically aligned in a <110> direction in the (110) plane. The size of each of the facet crystal grains is defined by both a longitudinal length "a" in a direction along the ridge bounding the paired sloped terraces in the form of the single roof and a transverse length "b" in a vertical direction to the ridge. The uniformity both in the crystal orientation or the direction of the ridges and in the sizes of the facet crystal grains results in substantially and periodically uniform undulations comprising the plural roofs, each of which comprises a pair of the sloped terraces bounded by the ridge. The longitudinal and transverse lengths "a" and "b" of each the facet crystal grains are varied depending upon epitaxial growth conditions such as a growth temperature and a growth rate and thickness of the layer, but may be considered to be almost uniform in the average. Only the second type magnetic layer 33 is patterned in the form of circle by a photolithography for subsequent measurement of magnetic torque by a torque magnetometer. It was confirmed that a <100> direction is an axis of easy magnetization whilst a <110> direction vertical to the <100> direction is an axis of hard magnetization. It was also confirmed that a large uniaxial anisotropy of Ku $10^6$ erg/cm$^3$ per unit volume is provided to the (110) plane. If the magnetic field is applied in the <100> direction along the axis of easy magnetization, then a rectangular magnetic hysteresis loop with a large coercive force whilst if the magnetic field is applied in the <110> direction along the axis of hard magnetization, then the slender looped magnetic hysteresis with a small coercive force is obtained as illustrated in FIG. 4.

It is very important that each facet crystal grain is sharp-pointed or tapered, for example, by the sloped terraces bounded by the one-dimensional ridge as illustrated in FIG. 3, because the second type magnetic layer epitaxially grown on the facet surface of each of the facet crystal grains of the intermetallic compound layer performs as a single magnetic domain thereby resulting in an extremely large coercive force of the second type magnetic layer which has an extremely large force to pin magnetization of the second type magnetic layer. As a result, the second type magnetic layer has the pinned magnetization which is hard to rotate even under a large magnetic field externally applied. The facet crystal grain has a major axis in the <100> direction and a minor axis in the <110> direction. Each of the facet crystal grains in the ferromagnetic layer performs as a single magnetic domain. If the magnetic field is applied in the <100> direction along the easy axis of magnetization, then the coercive force Hc is given by Hc=2Ku/Ms where Ku is a unidirectional energy and Ms is a saturation magnetization. If the second type magnetic layer 3 is made of Fe, then Ku=the order of $10^6$ erg/cm$^3$ and Ms is the order of 1700 erg/cm$^3$, and then the coercive force Hc is the order of 1 Oe.

If the magnetic field is applied in the <100> direction along the axis easy of magnetization which is parallel to the ridge of the facet, then the magnetization and the magnetoresistance are measured and the measured values are obtained as illustrated in FIGS. 5 and 6. FIG. 5 is a diagram illustrative of a magnetization hysteresis loop to describe facet crystal grains. FIG. 6 is a diagram illustrative of a magnetoresistance hysteresis loop to describe facet crystal grains. In FIGS. 5 and 6, the directions of the magnetization are represented by arrow marks. If a sufficiently large magnetic field is applied in the positive direction, then the magnetization of the first and second type magnetic layers 35 and 33 is ordered (Point "A" in FIGS. 5 and 6). The magnetic domains are unlikely to move due to the facet crystal grains with the uniform orientation. In the magnetic rotation mode, the magnetization is varied. If the external magnetic field is applied in the direction along the easy axis of magnetization, then the magnetization loop showing a larger coercive force Hc1 is obtained. In the state where the magnetization of the first and second magnetic layers 35 and 33 are parallel to each other, the externally applied magnetic field is dropped. As the externally applied magnetic field approaches zero and corresponds to a coercive force Hc2 of the first type magnetic layer, then the magnetization of the first type magnetic layer is inverted (Point "B" in FIGS. 5 and 6). If 0>H>—Hc1 where H is the externally applied magnetic field, then the first and second type magnetic layers are anti-paralleled in magnetization. If the magnetic field externally applied is shifted to the negative direction, then the first and second type magnetic layers 35 and 33 are ferromagnetically ordered (Point "C" in FIGS. 5 and 6). If the magnetic field externally applied is then shifted into the positive direction and as the magnetic field approaches zero, then the magnetization is inverted (Point "D" in FIGS. 5 and 6). If 0<H<Hc1 where H is the externally applied magnetic field, then the first and second type magnetic layers 35 and 33 are anti-paralleled in magnetization. If the magnetic field externally applied is further increased in the positive direction, the first and second type magnetic layers 35 and 33 are ferromagnetically ordered in magnetization and the pint is returned to the initial point "A" in FIGS. 5 and 6. Therefore, the magnetization and magnetoresistance hysteresis loops are obtained as illustrated in FIGS. 5 and 6. If the first and second magnetic layers 35 and 33 are anti-paralleled in magnetization, the electrical resistance is high. If the first and second magnetic layers 35 and 33 are paralleled in magnetization, the electrical resistance is low. The magnetoresistance is varied as illustrated in FIG. 6. In the vicinity of zero magnetic field, a rapid change in magnetoresistance appears. The magnetoresistance is kept until near the coercive force of the second type magnetic layer 33 and then rapidly dropped to zero.

As described above, of the second type magnetic layer 33, the magnetization is pinned in the direction along the easy axis of magnetization whilst the first type magnetic layer 35 separated by the non-magnetic spacer layer 34 from the second type magnetic layer 33 shows no interaction with the second type magnetic layer 33. For this reason, the first type magnetic layer 35 allows the magnetization free to rotate in accordance with the externally applied magnetic field. The above structure allows a spin valve operation of the magnetoresistance device. In order to cause the magnetization of the second type magnetic layer to rotate in the external magnetization direction, if, for example, the unidirectional anisotropy of the order of $10^6$ erg/cm$^3$ is provided to the second type magnetic layer, then a large magnetic field in the order of Hc1=1 kOe is required. The magnetization of the second type magnetic layer 33 is pinned by an apparently large exchange-coupling magnetic field, for which reason even if the above device is applied to a magnetic sensor such as magnetic head, then no rotation of magnetization of the second type magnetic layer 33 is caused and thereby a stable spin valve operation can be realized.

As a modification as illustrated in FIG. 8, it is possible to further provide a buffer layer 36 inserted between the second type magnetic layer and the substrate for relaxation of lattice miss-match between the substrate 31 and the second type magnetic layer 33. The buffer layer 36 may preferably comprise a body-centered cubic crystal structure made of V, Cr, Zr, Nb, Mo, Hf, Ta, W, and alloys thereof.

The above spin valve magnetoresistive multilayered structure may be formed by use of a molecular beam epitaxial system (ultra-high vacuum evaporation system). As a deposition source, an electron beam evaporation source is used. The system is provided with an electron gun and a fluorescent screen for reflection high-energy electron diffraction (RHEED) to evaluate the growing surface structure of the respective layers. The used epitaxial growth system is cable of making a vacuum of $1\times10^{-10}$ torr and the epitaxial growth is carried out in the order of $10^{-9}$ torr.

For various samples, the intermetallic compound layer 32 and the second type magnetic layers 33 are epitaxially grown under various conditions of substrate temperature and growth rate and various thicknesses thereof over various substrates 31. The second type magnetic layer has the body-centered crystal structure having facet crystal grains. Of each the facet crystal grain, the facet mean length "a" defined as the majority facet size in the direction along the ridge and the facet mean width "b" defined as the minority facet size in the direction vertical to the direction along the ridge are measured by an atomic force microscope (AFM). The results of measurements are represented as follows. Sample Nos. #34–36 have a buffer layer 36 inserted between the substrate 31 and the second type magnetic layer 33 for relaxation of lattice miss-match between the substrate 31 and the second type magnetic layer 33. The buffer layer 36 has a thickness of 13 nanometers and is made of Nb. The buffer layer 26 is grown under conditions of a substrate temperature of $T_B$=900° C., and a growth rate of 0.4 nanometers/second. If the buffer layer 26 made of V, Cr, Zr, Nb, Mo, Hf, Ta, W, V—Cr alloy, Nb—Ta alloy, Mo—Zr alloy, or Hf—W alloy is used, then the results are almost the same as those of the sample No. #46—48.

Over the second type magnetic layer 33, at room temperature, a non-magnetic spacer layer 34 having a thickness of 3 nanometers is grown. Further, a first type magnetic layer 35 having a thickness of 5 nanometers is formed over the non-magnetic spacer layer 34. The grown layers are then patterned by photo-lithography for measurement of magnetoresistance by a direct current four-probe method under a magnetic field of until 1.5 kOe at room temperature. Measured is a magnetic field Hc1 at which the magnetization of the ferromagnetic layer of the body-centered cubic crystal structure is inverted. Also measured is a magnetic field Hc2 at which the magnetization of the first type magnetic layer 35 is inverted. A magnetoresistance MR ratio is also measured.

Sample No. #37:

A NiAl intermetallic compound layer 32 having a thickness of 20 nanometers is epitaxially grown on a (11$\bar{2}$0) plane of an $Al_2O_3$ substrate at a substrate temperature of 200° C. and a growth rate of 0.1 nanometers/second. The measured facet mean length is 70 nanometers and the measured facet mean width is 15 nanometers. A $Ni_{81}Fe_{19}$ magnetic layer 33 having a thickness of 5 nanometers is epitaxially formed on the intermetallic compound layer 32. A Cu non-magnetic spacer layer 34 having a thickness of 3 nanometers is grown at room temperature on the magnetic layer 33. A Fe magnetic layer 35 having a thickness of 5 nanometers is formed over the non-magnetic spacer layer 34. The grown layers are then patterned by photo-lithography for measurement of magnetoresistance by a direct current four-probe method under a magnetic field of until 1.5 kOe at room temperature. The measured magnetic field Hc1 is 700 Oe. The measured magnetic field Hc2 is 10 Oe. The measured magnetoresistance MR ratio is 4%.

Sample No. #38:

A NiAl intermetallic compound layer 32 having a thickness of 20 nanometers is epitaxially grown on a (11$\bar{2}$0) plane of an $Al_2O_3$ substrate at a substrate temperature of –50° C. and a growth rate of 0.1 nanometers/second. The measured facet mean length is 30 nanometers and the measured facet mean width is 10 nanometers. A $Fe_{50}V_{50}$ magnetic layer 33 having a thickness of 5 nanometers is epitaxially formed on the intermetallic compound layer 32. A Cu non-magnetic spacer layer 34 having a thickness of 3 nanometers is grown at room temperature on the magnetic layer 33. A Fe magnetic layer 35 having a thickness of 5 nanometers is formed over the non-magnetic spacer layer 34. The grown layers are then patterned by photo-lithography for measurement of magnetoresistance by a direct current four-probe method under a magnetic field of until 1.5 kOe at room temperature. The measured magnetic field Hc1 is 850 Oe. The measured magnetic field Hc2 is 20 Oe. The measured magnetoresistance MR ratio is 6%.

Sample No. #39:

A CuPd intermetallic compound layer 32 having a thickness of 15 nanometers is epitaxially grown on a (11$\bar{2}$0) plane of an $Al_2O_3$ substrate at a substrate temperature of 200° C. and a growth rate of 0.05 nanometers/second. The measured facet mean length is 80 nanometers and the measured facet mean width is 15 nanometers. A Co magnetic layer 33 having a thickness of 5 nanometers is epitaxially formed on the intermetallic compound layer 32. An Ag non-magnetic spacer layer 34 having a thickness of 3 nanometers is grown at room temperature on the magnetic layer 33. A Ni magnetic layer 35 having a thickness of 5 nanometers is formed over the non-magnetic spacer layer 34. The grown layers are then patterned by photo-lithography for measurement of magnetoresistance by a direct current four-probe method under a magnetic field of until 1.5 kOe at room temperature. The measured magnetic field Hc1 is 750 Oe. The measured magnetic field Hc2 is 20 Oe. The measured magnetoresistance MR ratio is 5%.

Sample No. #40:

A CuZn intermetallic compound layer 32 having a thickness of 20 nanometers is epitaxially grown on a (11$\bar{2}$0) plane of an $Al_2O_3$ substrate at a substrate temperature of –50° C. and a growth rate of 0.5 nanometers/second. The measured facet mean length is 30 nanometers and the measured facet mean width is 10 nanometers. A $Co_{20}Pt_{80}$ magnetic layer 33 having a thickness of 5 nanometers is epitaxially formed on the intermetallic compound layer 32. A Ti non-magnetic spacer layer 34 having a thickness of 3 nanometers is grown at room temperature on the magnetic layer 33. A $Ni_{81}Fe_{19}$ magnetic layer 35 having a thickness of 5 nanometers is formed over the non-magnetic spacer layer 34. The grown layers are then patterned by photo-lithography for measurement of magnetoresistance by a direct current four-probe method under a magnetic field of until 1.5 kOe at room temperature. The measured magnetic field Hc1 is 1000 Oe. The measure5.

Sample No. #41:

A CuZn intermetallic compound layer 32 having a thickness of 25 nanometers is epitaxially grown on a (11$\bar{2}$0) plane of an Al$_2$O$_3$ substrate at a substrate temperature of 100° C. and a growth rate of 0.2 nanometers/second. The measured facet mean length is 80 nanometers and the measured facet mean width is 20 nanometers. A Fe magnetic layer 33 having a thickness of 5 nanometers is epitaxially formed on the intermetallic compound layer 32. A Ru non-magnetic spacer layer 34 having a thickness of 3 nanometers is grown at room temperature on the magnetic layer 33. A Ni$_{66}$Fe$_{16}$Co$_{18}$ magnetic layer 35 having a thickness of 5 nanometers is formed over the non-magnetic spacer layer 34. The grown layers are then patterned by photo-lithography for measurement of magnetoresistance by a direct current four-probe method under a magnetic field of until 1.5 kOe at room temperature. The measured magnetic field Hc1 is 850 Oe. The measured magnetic field Hc2 is 4 Oe. The measured magnetoresistance MR ratio is 4%.

Sample No. #42:

A NiAl intermetallic compound layer 32 having a thickness of 15 nanometers is epitaxially grown on a (110) plane of an MgO substrate at a substrate temperature of 30° C. and a growth rate of 0.3 nanometers/second. The measured facet mean length is 40 nanometers and the measured facet mean width is 15 nanometers. A Co$_{78}$Cr$_{19}$Ta$_3$ magnetic layer 33 having a thickness of 5 nanometers is epitaxially formed on the intermetallic compound layer 32. A Cu non-magnetic spacer layer 34 having a thickness of 3 nanometers is grown at room temperature on the magnetic layer 33. A Fe$_{85}$Al$_{5.4}$Si$_{9.6}$ magnetic layer 35 having a thickness of 5 nanometers is formed over the non-magnetic spacer layer 34. The grown layers are then patterned by photo-lithography for measurement of magnetoresistance by a direct current four-probe method under a magnetic field of until 1.5 kOe at room temperature. The measured magnetic field Hc1 is 980 Oe. The measured magnetic field Hc2 is 2 Oe. The measured magnetoresistance MR ratio is 5%.

Sample No. #43:

A CuPd intermetallic compound layer 32 having a thickness of 20 nanometers is epitaxially grown on a (110) plane of an MgO substrate at a substrate temperature of 50° C. and a growth rate of 0.5 nanometers/second. The measured facet mean length is 40 nanometers and the measured facet mean width is 10 nanometers. A Sm$_{95}$Co$_5$ magnetic layer 33 having a thickness of 5 nanometers is epitaxially formed on the intermetallic compound layer 32. A Cu non-magnetic spacer layer 34 having a thickness of 3 nanometers is grown at room temperature on the magnetic layer 33. An a—CoZr magnetic layer 35 having a thickness of 5 nanometers is formed over the non-magnetic spacer layer 34. The grown layers are then patterned by photo-lithography for measurement of magnetoresistance by a direct current four-probe method under a magnetic field of until 1.5 kOe at room temperature. The measured magnetic field Hc1 is 1050 Oe. The measured magnetic field Hc2 is 2 Oe. The measured magnetoresistance MR ratio is 5%.

Sample No. #44:

A NiAl intermetallic compound layer 32 having a thickness of 20 nanometers is epitaxially grown on a (11$\bar{2}$0) plane of an SiO$_2$ substrate at a substrate temperature of 50° C. and a growth rate of 0.5 nanometers/second. The measured facet mean length is 70 nanometers and the measured facet mean width is 10 nanometers. A Fe$_{50}$V$_{50}$ magnetic layer 33 having a thickness of 5 nanometers is epitaxially formed on the intermetallic compound layer 32. A Cu non-magnetic spacer layer 34 having a thickness of 3 nanometers is grown at room temperature on the magnetic layer 33. A Ni$_{81}$Fe$_{19}$ magnetic layer 35 having a thickness of 5 nanometers is formed over the non-magnetic spacer layer 34. The grown layers are then patterned by photo-lithography for measurement of magnetoresistance by a direct current four-probe method under a magnetic field of until 1.5 kOe at room temperature. The measured magnetic field Hc1 is 800 Oe. The measured magnetic field Hc2 is 3 Oe. The measured magnetoresistance MR ratio is 4%.

Sample No. #45:

A CuPd intermetallic compound layer 32 having a thickness of 20 nanometers is epitaxially grown on a (11$\bar{2}$0) plane of an SiO$_2$ substrate at a substrate temperature of 100° C. and a growth rate of 0.5 nanometers/second. The measured facet mean length is 80 nanometers and the measured facet mean width is 20 nanometers. A Fe$_{50}$Co$_{50}$ magnetic layer 33 having a thickness of 5 nanometers is epitaxially formed on the intermetallic compound layer 32. An Ag non-magnetic spacer layer 34 having a thickness of 3 nanometers is grown at room temperature on the magnetic layer 33. A Ni$_{24}$Fe$_{15}$Co$_{61}$ magnetic layer 35 having a thickness of 5 nanometers is formed over the non-magnetic spacer layer 34. The grown layers are then patterned by photo-lithography for measurement of magnetoresistance by a direct current four-probe method under a magnetic field of until 1.5 kOe at room temperature. The measured magnetic field Hc1 is 950 Oe. The measured magnetic field Hc2 is 2 Oe. The measured magnetoresistance MR ratio is 5%.

Sample No. #46:

A NiAl intermetallic compound layer 32 having a thickness of 15 nanometers is epitaxially grown on a (11$\bar{2}$0) plane of an Al$_2$O$_3$ substrate at a substrate temperature of 30° C. and a growth rate of 1.0 nanometers/second. The measured facet mean length is 30 nanometers and the measured facet mean width is 10 nanometers. A Co$_{80}$Cr$_{20}$ magnetic layer 33 having a thickness of 5 nanometers is epitaxially formed on the intermetallic compound layer 32. A Cu non-magnetic spacer layer 34 having a thickness of 3 nanometers is grown at room temperature on the magnetic layer 33. A Ni$_{81}$Fe$_{19}$ magnetic layer 35 having a thickness of 5 nanometers is formed over the non-magnetic spacer layer 34. The grown layers are then patterned by photo-lithography for measurement of magnetoresistance by a direct current four-probe method under a magnetic field of until 1.5 kOe at room temperature. The measured magnetic field Hc1 is 800 Oe. The measured magnetic field Hc2 is 3 Oe. The measured magnetoresistance MR ratio is 5%.

Sample No. #47:

A CuZn magnetic layer 33 having a thickness of 15 nanometers is epitaxially grown on a (110) plane of an MgO substrate at a substrate temperature of 50° C. and a growth rate of 2.0 nanometers/second. The measured facet mean length is 40 nanometers and the measured facet mean width is 25 nanometers. A Ni magnetic layer 33 having a thickness of 5 nanometers is epitaxially formed on the intermetallic compound layer 32. A Cu non-magnetic spacer layer 34 having a thickness of 3 nanometers is grown at room temperature on the magnetic layer 33. A Ni$_{81}$Fe$_{19}$ magnetic layer 35 having a thickness of 5 nanometers is formed over the non-magnetic spacer layer 34. The grown layers are then patterned by photo-lithography for measurement of magnetoresistance by a direct current four-probe method under a magnetic field of until 1.5 kOe at room temperature. The measured magnetic field Hc1 is 650 Oe. The measured magnetic field Hc2 is 3 Oe. The measured magnetoresistance MR ratio is 3%.

Sample No. #48:

A CuPd intermetallic compound layer 32 having a thickness of 20 nanometers is epitaxially grown on a (11$\bar{2}$0) plane of an SiO$_2$ substrate at a substrate temperature of 50° C. and a growth rate of 3.0 nanometers/second. The measured facet mean length is 40 nanometers and the measured facet mean width is 10 nanometers. A Co magnetic layer 33 having a thickness of 5 nanometers is epitaxially formed on the intermetallic compound layer 32. A Cu non-magnetic spacer layer 34 having a thickness of 3 nanometers is grown at room temperature on the magnetic layer 33. A Ni$_{81}$Fe$_{19}$ magnetic layer 35 having a thickness of 5 nanometers is formed over the non-magnetic spacer layer 34. The grown layers are then patterned by photo-lithography for measurement of magnetoresistance by a direct current four-probe method under a magnetic field of until 1.5 kOe at room temperature. The measured magnetic field Hc1 is 850 Oe. The measured magnetic field Hc2 is 3 Oe. The measured magnetoresistance MR ratio is 3%.

Comparative Sample No. #4:

A NiAl intermetallic compound layer 32 free of facet crystal grain and having a thickness of 2 nanometers is epitaxially grown on a glass substrate. A Co magnetic layer 33 having a thickness of 2.5 nanometers is epitaxially formed on the intermetallic compound layer 32. A Cu non-magnetic spacer layer 34 having a thickness of 3 nanometers is grown at room temperature on the magnetic layer 33. A Ni$_{81}$Fe$_{19}$ magnetic layer 35 having a thickness of 2.5 nanometers is formed over the non-magnetic spacer layer 34. The grown layers are then patterned by photo-lithography for measurement of magnetoresistance by a direct current four-probe method under a magnetic field of until 1.5 kOe at room temperature. The measured magnetic field Hc1 is 40 Oe. The measured magnetic field Hc2 is 5 Oe. The measured magnetoresistance MR ratio is 3%.

Whereas modifications of the present invention will be apparent to a person having ordinary skill in the art, to which the invention pertains, it is to be understood that embodiments as shown and described by way of illustrations are by no means intended to be considered in a limiting sense. Accordingly, it is to be intended to cover by claims any modifications of the present invention which fall within the spirit and scope of the present invention.

What is claimed is:

1. A spin valve magnetoresistive multi-layered structure including:

a first magnetic layer which magnetization is free to rotate in accordance with an external applied magnetic field;

a non-magnetic spacer layer adjacent to said first magnetic film; and a second magnetic layer adjacent to said non-magnetic film so that said first magnetic layer is separated by said non-magnetic spacer layer from said second magnetic layer, wherein said second magnetic layer has a facet single crystal grain structure with a uniform crystal orientation whilst said first magnetic layer is free of any facet single crystal grain structure with a uniform crystal orientation.

2. The spin valve magnetoresistive multi-layered structure as claimed in claim 1, wherein each crystal grain of said facet single crystal grain structure in said second magnetic layer has a facet surface interfaced with said non-magnetic spacer layer.

3. The spin valve magnetoresistive multi-layered structure as claimed in claim 1, wherein each crystal grain of said facet single crystal grain structure in said second magnetic layer has a facet surface formed on an opposite surface to an interface with said non-magnetic spacer layer.

4. The spin valve magnetoresistive multi-layered structure as claimed in claim 1, wherein said second magnetic layer comprises a ferromagnetic metal having a body-centered cubic lattice structure epitaxially grown in a [110] direction so that each crystal grain of said facet single crystal grain structure has a facet surface which comprises a pair of sloped terraces bounded by a ridge which is parallel to a <001> direction in a (110) plane and said crystal grains of said facet single crystal grain structure are periodically aligned in a <110> direction in said (110) plane.

5. The spin valve magnetoresistive multi-layered structure as claimed in claim 1, wherein said second magnetic layer comprises a ferromagnetic metal alloy having a body-centered cubic lattice structure epitaxially grown in a [110] direction so that each crystal grain of said facet single crystal grain structure has a facet surface which comprises a pair of sloped terraces bounded by a ridge which is parallel to a <001> direction in a (110) plane and said crystal grains of said facet single crystal grain structure are periodically aligned in a <110> direction in said (110) plane.

6. A spin valve magnetoresistive multi-layered structure including:

a first magnetic layer which magnetization is free to rotate in accordance with an external applied magnetic field;

a non-magnetic spacer layer adjacent to said first magnetic film;

a second magnetic layer adjacent to said non-magnetic film so that said first magnetic layer is separated by said non-magnetic spacer layer from said second magnetic layer; and a ferromagnetic layer adjacent to said second magnetic layer wherein said ferromagnetic layer has a facet single crystal grain structure with a uniform crystal orientation whilst said first magnetic layer is free of any facet single crystal grain structure with a uniform crystal orientation.

7. The spin valve magnetoresistive multi-layered structure as claimed in claim 6, wherein each crystal grain of said facet single crystal grain structure in said ferromagnetic layer has a facet surface interfaced with said second magnetic layer.

8. The spin valve magnetoresistive multi-layered structure as claimed in claim 6, wherein said ferromagnetic layer comprises a ferromagnetic metal having a body-centered cubic lattice structure epitaxially grown in a [110] direction so that each crystal grain of said facet single crystal grain structure has a facet surface which comprises a pair of sloped terraces bounded by a ridge which is parallel to a <001> direction in a (110) plane and said crystal grains of said facet single crystal grain structure are periodically aligned in a <110> direction in said (110) plane.

9. The spin valve magnetoresistive multi-layered structure as claimed in claim 6, wherein said ferromagnetic layer comprises a ferromagnetic metal alloy having a body-centered lattice structure epitaxially grown in a [110] direction so that each crystal grain of said facet single crystal grain structure has a facet surface which comprises a pair of sloped terraces bounded by a ridge which is parallel to a <001> direction in a (110) plane and said crystal grains of said facet single crystal grain structure are periodically aligned in a <110> direction in said (110) plane.

10. A spin valve magnetoresistive multi-layered structure including:

a first magnetic layer which magnetization is free to rotate in accordance with an external applied magnetic field;

a non-magnetic spacer layer adjacent to said first magnetic film;

a second magnetic layer adjacent to said non-magnetic film so that said first magnetic layer is separated by said non-magnetic spacer layer from said second magnetic layer; and a non-magnetic layer adjacent to said second magnetic layer wherein said non-magnetic layer has a facet single crystal grain structure with a uniform crystal orientation, whilst said first magnetic layer is free of any facet single crystal grain structure with a uniform crystal orientation.

11. The spin valve magnetoresistive multi-layered structure as claimed in claim 10, wherein each crystal grain of said facet single crystal grain structure in said non-magnetic layer has a facet surface interfaced with said second magnetic layer.

12. The spin valve magnetoresistive multi-layered structure as claimed in claim 10, wherein said non-magnetic layer comprises a non-magnetic metal alloy having a body-centered cubic lattice structure epitaxially grown in a [110] direction so that each crystal grain of said facet single crystal grain structure has a facet surface which comprises a pair of sloped terraces bounded by a ridge which is parallel to a <001> direction in a (110) plane and said crystal grains of said facet single crystal grain structure are periodically aligned in a <110> direction in said (110) plane.

13. The spin valve magnetoresistive multi-layered structure as claimed in claim 10, wherein said non-magnetic layer comprises an intermetallic compound having a CsCl lattice structure epitaxially grown in a [110] direction so that each crystal grain of said facet single crystal grain structure has a facet surface which comprises a pair of sloped terraces bounded by a ridge which is parallel to a <001> direction in a (110) plane and said crystal grains of said facet single crystal grain structure are periodically aligned in a <110> direction in said (110) plane.

14. A spin valve magnetoresistive device including a substrate and a multi-layered structure formed on said substrate, said multi-layered structure comprising:

a first magnetic layer which magnetization is free to rotate in accordance with an external applied magnetic field;

a non-magnetic spacer layer extending on a bottom surface of said first magnetic film; and a second magnetic layer extending on a bottom surface of said non-magnetic film so that said first magnetic layer is separated by said non-magnetic spacer layer from said second magnetic layer, said second magnetic layer extending on a top surface of said substrate, wherein said second magnetic layer has a facet single crystal grain structure with a uniform crystal orientation whilst said first magnetic layer is free of any facet single crystal grain structure with a uniform crystal orientation.

15. The spin valve magnetoresistive device as claimed in claim 14, further comprising a buffer layer inserted between said second magnetic layer and said substrate.

16. The spin valve magnetoresistive device as claimed in claim 14, wherein each crystal grain of said facet single crystal grain structure in said second magnetic layer has a facet surface interfaced with said non-magnetic spacer layer.

17. The spin valve magnetoresistive device as claimed in claim 14, wherein each crystal grain of said facet single crystal grain structure in said second magnetic layer has a facet surface formed on an opposite surface to an interface with said non-magnetic spacer layer.

18. The spin valve magnetoresistive device as claimed in claim 14, wherein said second magnetic layer comprises a ferromagnetic metal having a body-centered cubic lattice structure epitaxially grown in a [110] direction so that each crystal grain of said facet single crystal grain structure has a facet surface which comprises a pair of sloped terraces bounded by a ridge which is parallel to a <001> direction in a (110) plane and said crystal grains of said facet single crystal grain structure are periodically aligned in a <110> direction in said (110) plane.

19. The spin valve magnetoresistive device as claimed in claim 14, wherein said second magnetic layer comprises a ferromagnetic metal alloy having a body-centered cubic lattice structure epitaxially grown in a [110] direction so that each crystal grain of said facet single crystal grain structure has a facet surface which comprises a pair of sloped terraces bounded by a ridge which is parallel to a <001> direction in a (110) plane and said crystal grains of said facet single crystal grain structure are periodically aligned in a <110> direction in said (110) plane.

20. The spin valve magnetoresistive device as claimed in claim 14, wherein said substrate comprises a sapphire substrate with a (11$\bar{2}$0) plane.

21. The spin valve magnetoresistive device as claimed in claim 14 wherein said substrate comprises a magnesium oxide substrate with a (110) plane.

22. The spin valve magnetoresistive device as claimed in claim 14, wherein said substrate comprises a quartz substrate with a (11$\bar{2}$0) plane.

23. A spin valve magnetoresistive device including a substrate and a multi-layered structure formed on said substrate, said multi-layered structure comprising:

a first magnetic layer which magnetization is free to rotate in accordance with an external applied magnetic field;

a non-magnetic spacer layer extending on a bottom surface of said first magnetic film;

a second magnetic layer extending on a bottom surface of said non-magnetic film so that said first magnetic layer is separated by said non-magnetic spacer layer from said second magnetic layer; and a ferromagnetic layer extending on a bottom surface of said second magnetic layer, said ferromagnetic layer extending on a top surface of said substrate, wherein said ferromagnetic layer has a facet single crystal grain structure with a uniform crystal orientation whilst said first magnetic layer is free of any facet single crystal grain structure with a uniform crystal orientation.

24. The spin valve magnetoresistive device as claimed in claim 23, further comprising a buffer layer inserted between said ferromagnetic layer and said substrate.

25. The spin valve magnetoresistive device as claimed in claim 23, wherein each crystal grain of said facet single crystal grain structure in said ferromagnetic layer has a facet surface interfaced with said second magnetic layer.

26. The spin valve magnetoresistive device as claimed in claim 23, wherein said ferromagnetic layer comprises a ferromagnetic metal having a body-centered cubic lattice structure epitaxially grown in a [110] direction so that each crystal grain of said facet single crystal grain structure has a facet surface which comprises a pair of sloped terraces bounded by a ridge which is parallel to a <001> direction in a (110) plane and said crystal grains of said facet single crystal grain structure are periodically aligned in a <110> direction in said (110) plane.

27. The spin valve magnetoresistive device as claimed in claim 23, wherein said ferromagnetic layer comprises a ferromagnetic metal alloy having a body-centered cubic lattice structure epitaxially grown in a [110] direction so that each crystal grain of said facet single crystal grain structure has a facet surface which comprises a pair of sloped terraces bounded by a ridge which is parallel to a <001> direction in a (110) plane and said crystal grains of said facet single crystal grain structure are periodically aligned in a <110> direction in said (110) plane.

28. The spin valve magnetoresistive device as claimed in claim 23, wherein said substrate comprises a sapphire substrate with a (1120) plane.

29. The spin valve magnetoresistive device as claimed in claim 23, wherein said substrate comprises a magnesium oxide substrate with a (110) plane.

30. The spin valve magnetoresistive device as claimed in claim 23, wherein said substrate comprises a quartz substrate with a (1120) plane.

31. A spin valve magnetoresistive device including a substrate and a multi-layered structure formed on said substrate, said multi-layered structure comprising:

a first magnetic layer which magnetization is free to rotate in accordance with an external applied magnetic field;

a non-magnetic spacer layer extending on a bottom surface of said first magnetic film;

a second magnetic layer extending on a bottom surface of said non-magnetic film so that said first magnetic layer is separated by said non-magnetic spacer layer from said second magnetic layer; and a non-magnetic layer extending on a bottom surface of said second magnetic layer, said non-magnetic layer extending on a top surface of said substrate, wherein said non-magnetic layer has a facet single crystal grain structure with a uniform crystal orientation, whilst said first magnetic layer is free of any facet single crystal grain structure with a uniform crystal orientation.

32. The spin valve magnetoresistive device as claimed in claim 31, further comprising a buffer layer inserted between said non-magnetic layer and said substrate.

33. The spin valve magnetoresistive device as claimed in claim 31, wherein each crystal grain of said facet single crystal grain structure in said non-magnetic layer has a facet surface interfaced with said second magnetic layer.

34. The spin valve magnetoresistive device as claimed in claim 31, wherein said non-magnetic layer comprises a non-magnetic metal alloy having a body-centered cubic lattice structure epitaxially grown in a [110] direction so that each crystal grain of said facet single crystal grain structure has a facet surface which comprises a pair of sloped terraces bounded by a ridge which is parallel to a <001> direction in a (110) plane and said crystal grains of said facet single crystal grain structure are periodically aligned in a <110> direction in said (110) plane.

35. The spin valve magnetoresistive device as claimed in claim 31, wherein said non-magnetic layer comprises an intermetallic compound having a CsCl lattice structure epitaxially grown in a [110] direction so that each crystal grain of said facet single crystal grain structure has a facet surface which comprises a pair of sloped terraces bounded by a ridge which is parallel to a <001> direction in a (110) plane and said crystal grains of said facet single crystal grain structure are periodically aligned in a <110> direction in said (110) plane.

36. The spin valve magnetoresistive device as claimed in claim 31, wherein said substrate comprises a sapphire substrate with a (1120) plane.

37. The spin valve magnetoresistive device as claimed in claim 31, wherein said substrate comprises a magnesium oxide substrate with a (110) plane.

38. The spin valve magnetoresistive device as claimed in claim 31, wherein said substrate comprises a quartz substrate with a (1120) plane.

* * * * *